United States Patent
Krebs et al.

(10) Patent No.: US 8,121,823 B2
(45) Date of Patent: Feb. 21, 2012

(54) ITERATIVE INVERSION OF DATA FROM SIMULTANEOUS GEOPHYSICAL SOURCES

(75) Inventors: Jerome R. Krebs, Houston, TX (US); John E. Anderson, Houston, TX (US); Ramesh Neelamani, Houston, TX (US); Charlie Jing, Houston, TX (US); David Hinkley, Spring, TX (US); Thomas A. Dickens, Houston, TX (US); Christine E. Krohn, Houston, TX (US); Peter Traynin, Cypress, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 317 days.

(21) Appl. No.: 12/441,685

(22) PCT Filed: Sep. 11, 2007

(86) PCT No.: PCT/US2007/019724
§ 371 (c)(1),
(2), (4) Date: Mar. 17, 2009

(87) PCT Pub. No.: WO2008/042081
PCT Pub. Date: Apr. 10, 2008

(65) Prior Publication Data
US 2010/0018718 A1    Jan. 28, 2010

Related U.S. Application Data

(60) Provisional application No. 60/847,696, filed on Sep. 28, 2006.

(51) Int. Cl.
*G06G 7/48* (2006.01)
(52) U.S. Cl. ........................................................ 703/10
(58) Field of Classification Search ...................... 703/10
See application file for complete search history.

(56) References Cited

U.S. PATENT DOCUMENTS

| 3,812,457 A | 5/1974 | Weller | 367/36 |
| 3,864,667 A | 2/1975 | Bahjat | 367/48 |
| 4,159,463 A | 6/1979 | Silverman | 367/59 |

(Continued)

FOREIGN PATENT DOCUMENTS

| EP | 1 094 338 | 4/2001 |

(Continued)

OTHER PUBLICATIONS

P. Shen et al., "Differential semblance velocity analysis by wave-equation migration", 2003, 73rd Annual Meeting of Society of Exploration Geophysicists, four unnumbered pages.*

(Continued)

*Primary Examiner* — Paul Rodriguez
*Assistant Examiner* — Russ Guill

(57) ABSTRACT

Method for reducing the time needed to perform geophysical inversion by using simultaneous encoded sources in the simulation steps of the inversion process. The geophysical survey data are prepared by encoding (3) a group of source gathers (1), using for each gather a different encoding signature selected from a set (2) of non-equivalent encoding signatures. Then, the encoded gathers are summed (4) by summing all traces corresponding to the same receiver from each gather, resulting in a simultaneous encoded gather. (Alternatively, the geophysical data are acquired from simultaneously encoded sources.) The simulation steps needed for inversion are then calculated using a particular assumed velocity (or other physical property) model (5) and simultaneously activated encoded sources using the same encoding scheme used on the measured data. The result is an updated physical properties model (6) that may be further updated (7) by additional iterations.

26 Claims, 8 Drawing Sheets

U.S. PATENT DOCUMENTS

| | | | |
|---|---|---|---|
| 4,168,485 A | 9/1979 | Payton et al. | 367/41 |
| 4,545,039 A | 10/1985 | Savit | 367/39 |
| 4,562,650 A | 1/1986 | Nagasawa | 34/612 |
| 4,575,830 A | 3/1986 | Ingram et al. | 367/26 |
| 4,594,662 A | 6/1986 | Devaney | 700/90 |
| 4,636,956 A | 1/1987 | Vannier et al. | 702/14 |
| 4,675,851 A | 6/1987 | Savit et al. | 367/41 |
| 4,686,654 A | 8/1987 | Savit | 367/41 |
| 4,707,812 A | 11/1987 | Martinez | 367/46 |
| 4,715,020 A | 12/1987 | Landrum, Jr. | 367/38 |
| 4,766,574 A * | 8/1988 | Whitmore et al. | 367/50 |
| 4,780,856 A | 10/1988 | Becquey | 367/23 |
| 4,823,326 A | 4/1989 | Ward | 367/41 |
| 4,924,390 A | 5/1990 | Parsons et al. | 702/14 |
| 4,953,657 A | 9/1990 | Edington | 181/111 |
| 4,969,129 A | 11/1990 | Currie | 367/41 |
| 4,982,374 A | 1/1991 | Edington et al. | 367/48 |
| 5,260,911 A | 11/1993 | Mason et al. | 367/57 |
| 5,677,893 A | 10/1997 | de Hoop et al. | 367/50 |
| 5,715,213 A | 2/1998 | Allen | 367/48 |
| 5,717,655 A | 2/1998 | Beasley | 367/53 |
| 5,719,821 A | 2/1998 | Sallas et al. | 367/41 |
| 5,721,710 A | 2/1998 | Sallas et al. | 367/41 |
| 5,790,473 A | 8/1998 | Allen | 367/57 |
| 5,798,982 A | 8/1998 | He et al. | 367/73 |
| 5,822,269 A | 10/1998 | Allen | 367/41 |
| 5,838,634 A | 11/1998 | Jones et al. | 367/73 |
| 5,852,588 A | 12/1998 | de Hoop et al. | 367/38 |
| 5,878,372 A | 3/1999 | Tabarovsky et al. | 702/7 |
| 5,920,838 A | 7/1999 | Mostow | 704/255 |
| 5,924,049 A | 7/1999 | Beasley et al. | 702/14 |
| 5,999,488 A | 12/1999 | Smith | 367/50 |
| 5,999,489 A | 12/1999 | Lazaratos | 367/57 |
| 6,014,342 A | 1/2000 | Lazaratos | 367/38 |
| 6,021,094 A | 2/2000 | Ober et al. | 367/53 |
| 6,028,818 A | 2/2000 | Jeffryes | 367/20 |
| 6,058,073 A | 5/2000 | VerWest | 367/31 |
| 6,125,330 A | 9/2000 | Robertson et al. | 702/14 |
| 6,219,621 B1 | 4/2001 | Hornbostel | 702/169 |
| 6,311,133 B1 | 10/2001 | Lailly et al. | 702/13 |
| 6,317,695 B1 | 11/2001 | Zhou et al. | 702/17 |
| 6,327,537 B1 | 12/2001 | Ikelle | 702/14 |
| 6,374,201 B1 | 4/2002 | Grizon et al. | 703/10 |
| 6,388,947 B1 | 5/2002 | Washbourne et al. | 367/73 |
| 6,480,790 B1 | 11/2002 | Calvert et al. | 702/14 |
| 6,522,973 B1 | 2/2003 | Tonellot et al. | 702/16 |
| 6,545,944 B2 | 4/2003 | de Kok | 367/56 |
| 6,549,854 B1 | 4/2003 | Malinverno et al. | 702/16 |
| 6,574,564 B2 | 6/2003 | Lailly et al. | 702/14 |
| 6,662,147 B1 | 12/2003 | Fournier et al. | 703/10 |
| 6,665,615 B2 | 12/2003 | Van Riel et al. | 702/2 |
| 6,687,619 B2 | 2/2004 | Moerig et al. | 702/14 |
| 6,687,659 B1 | 2/2004 | Shen | 703/2 |
| 6,704,245 B2 | 3/2004 | Becquey | 367/39 |
| 6,714,867 B2 | 3/2004 | Meunier | 702/2 |
| 6,754,590 B1 | 6/2004 | Moldoveanu | 702/14 |
| 6,766,256 B2 | 7/2004 | Jeffryes | 702/17 |
| 6,826,486 B1 | 11/2004 | Malinverno | 702/16 |
| 6,836,448 B2 | 12/2004 | Robertsson et al. | 367/56 |
| 6,842,701 B2 | 1/2005 | Moerig et al. | 702/14 |
| 6,859,734 B2 | 2/2005 | Bednar | 702/14 |
| 6,865,488 B2 | 3/2005 | Moerig et al. | 702/14 |
| 6,876,928 B2 | 4/2005 | Van Riel et al. | 702/2 |
| 6,882,938 B2 | 4/2005 | Vaage et al. | 702/17 |
| 6,901,333 B2 | 5/2005 | Van Riel et al. | 702/18 |
| 6,903,999 B2 | 6/2005 | Curtis et al. | 367/38 |
| 6,944,546 B2 | 9/2005 | Xiao et al. | 702/6 |
| 6,947,843 B2 | 9/2005 | Fisher et al. | 702/14 |
| 6,999,880 B2 | 2/2006 | Lee | 702/14 |
| 7,046,581 B2 | 5/2006 | Calvert | 367/57 |
| 7,050,356 B2 | 5/2006 | Jeffryes | 367/41 |
| 7,072,767 B2 | 7/2006 | Routh et al. | 702/14 |
| 7,092,823 B2 | 8/2006 | Lailly et al. | 702/14 |
| 7,110,900 B2 | 9/2006 | Adler et al. | 702/76 |
| 7,230,879 B2 | 6/2007 | Herkenoff et al. | 367/47 |
| 7,271,747 B2 | 9/2007 | Baraniuk et al. | 341/87 |
| 7,330,799 B2 | 2/2008 | Lefebvre et al. | 702/75 |
| 7,373,251 B2 | 5/2008 | Hamman et al. | 702/14 |
| 7,373,252 B2 | 5/2008 | Sherrill et al. | 702/17 |
| 7,376,046 B2 | 5/2008 | Jeffryes | 367/41 |
| 7,436,734 B2 | 10/2008 | Krohn | 367/43 |
| 7,480,206 B2 | 1/2009 | Hill | 367/73 |
| 7,584,056 B2 | 9/2009 | Koren | 702/14 |
| 7,599,798 B2 * | 10/2009 | Beasley et al. | 702/17 |
| 7,602,670 B2 | 10/2009 | Jeffryes | |
| 7,646,924 B2 | 1/2010 | Donoho | |
| 7,672,194 B2 | 3/2010 | Jeffryes | |
| 7,675,815 B2 | 3/2010 | Saenger et al. | |
| 7,679,990 B2 | 3/2010 | Herkenhoff et al. | |
| 7,715,985 B2 | 5/2010 | Van Manen et al. | |
| 7,725,266 B2 | 5/2010 | Sirgue et al. | 702/17 |
| 7,835,072 B2 | 11/2010 | Izumi | |
| 7,840,625 B2 | 11/2010 | Candes et al. | |
| 2002/0099504 A1* | 7/2002 | Cross et al. | 702/2 |
| 2002/0120429 A1 | 8/2002 | Ortoleva | |
| 2002/0183980 A1 | 12/2002 | Guillaume | |
| 2004/0199330 A1* | 10/2004 | Routh et al. | 702/14 |
| 2005/0075789 A1 | 4/2005 | Xiao et al. | 702/6 |
| 2006/0056272 A1 | 3/2006 | Hill | 367/73 |
| 2006/0235666 A1* | 10/2006 | Assa et al. | 703/10 |
| 2007/0274155 A1 | 11/2007 | Ikelle | |
| 2008/0175101 A1 | 7/2008 | Saenger et al. | |
| 2008/0306692 A1 | 12/2008 | Singer et al. | |
| 2009/0248308 A1 | 10/2009 | Luling | |
| 2009/0259406 A1 | 10/2009 | Khadhraoui et al. | |
| 2010/0008184 A1 | 1/2010 | Hegna et al. | |
| 2010/0018718 A1 | 1/2010 | Krebs et al. | |
| 2010/0142316 A1 | 6/2010 | Keers et al. | |

FOREIGN PATENT DOCUMENTS

| | | |
|---|---|---|
| EP | 1 746 443 | 1/2007 |
| GB | 2 390 712 | 1/2004 |
| GB | 2 391 665 | 2/2004 |
| WO | WO 2007/046711 | 4/2007 |
| WO | WO 2008/042081 | 4/2008 |
| WO | WO 2008/123920 | 10/2008 |
| WO | WO 2009/067041 | 5/2009 |
| WO | WO 2009/117174 | 9/2009 |

OTHER PUBLICATIONS

Ruey-Chyuan Shih et al., "Iterative pre-stack depth migration with velocity analysis", 1996, Terrestrial, Atmospheric and Oceanic Sciences, vol. 7, No. 2, pp. 149-158.*

S. Ostmo et al., "Finite-difference iterative migration by linearized waveform inversion in the frequency domain," 2002, SEG International Exposition and 72nd Annual Meeting, four pages.*

Heiner Igel et al., "Waveform inversion of marine reflection seismograms for P-impedance and Poisson's ratio", 1996, downloaded from CiteSeerX at citeseerx.ist.psu.edu, pp. 17-43.*

*European Search Report* dated Mar. 17, 2007 (RS 114505).

*PCT International Search and Written Opinion* dated Mar. 7, 2008 for PCT/US2007/019724.

Beasley, C. J. (1998), "A new look at simultaneous sources," *SEG Int'l. Expostition and 68th Annual Meeting Expanded Abstracts*, pp. 133-136.

Becquey, M. et al. (2002), "Pseudo-Random Coded Simultaneous Vibroseismics," *SEG Int'l. Exposition and 72th Annl Mtg*, 4 pages.

Berkhout, A. J. (1992), "Areal Shot Record Technology," *Journal of Seismic Exploration* 1, pp. 251-264.

Bonomi, E. et al. (2006), "Wavefield Migration plus Monte Carlo Imaging of 3D Prestack Seismic Data," *Geophysical Prospecting* 54, pp. 505-514.

Fallat, M. R. (1999), "Geoacoustic inversion via local, global, and hybrid algorithms," *Journal of the Acoustical Society of America* 105, pp. 3219-3230.

Jing, X. et al. (2000), "Encoding multiple shot gathers in prestack migration," *SEG Int'l. Exposition and 70th Annual Meeting Expanded Abstracts*, pp. 786-789.

Liao, Q. et al. (1995), "2.5D full-wavefield viscoacoustic inversion," *Geophysical Prospecting* 43, pp. 1043-1059.

Mora, P. (1987), "Nonlinear two-dimensional elastic inversion of multi-offset seismic data," *Geophysics* 52, pp. 1211-1228.

Romero, L. A. (2000), "Phase encoding of shot records in prestack migration," *Geophysics* 65, 426-436.

Sirgue, L. (2004) "Efficient waveform inversion and imaging: A strategy for selecting temporal frequencies," *Geophysics* 69, 231-248.

Tarantola, A. (1984), "Inversion of seismic reflection data in the acoustic approximation," *Geophysics* 49, 1259-1266.

Weglein, A. B. (2003), "Inverse scattering series and seismic exploration," *Inverse Problems* 19, pp. R27-R83.

van Manen, D. J. et al. (2005), "Making wave by time reversal," *SEG International Exposition and 75th Annual Meeting Expanded Abstracts*, pp. 1763-1766.

Zhang, Yu (2005), "Delayed-shot 3D depth migration," *Geophysics* 70, pp. E21-E28.

Aki, K. et al. (1980), "Quantitative Seismology: Theory and Methods vol. I—Chapter 7—Surface Waves in a Vertically Heterogenous Medium," W.H. Freeman and Co., pp. 259-318.

Aki, K. et al. (1980), "Quantitative Seismology: Theory and Methods vol. I," W.H. Freeman and Co., p. 173.

Beylkin, G. (1985), "Imaging of discontinuities in the inverse scattring problem by inversion of a causal generalized Radon transform," *J. Math. Phys.* 26, pp. 99-108.

Beaty, K.S. et al. (2003), "Repeatability of multimode Rayleigh-wave dispersion studies," *Geophysics* 68(3), pp. 782-790.

Beaty, K.S. et al. (2002), "Simulated annealing inversion of multimode Rayleigh wave dispersion waves for geological structure," *Geophys. J. Int.* 151, pp. 622-631.

Berkhout, A.J. (1987), "Applied Seismic Wave Theory," Elsevier Science Publishers, p. 142.

Bunks, C., et al. (1995), "Multiscale seismic waveform inversion," *Geophysics* 60, pp. 1457-1473.

Chavent, G. et al. (1999), "An optimal true-amplitude least-squares prestack depth-migration operator," *Geophysics* 64(2), pp. 508-515.

Dziewonski A. et al. (1981), "Preliminary Reference Earth Model", *Phys. Earth Planet. Int.* 25(4), pp. 297-356.

Ernst, F.E. et al. (2000), "Tomography of dispersive media," *J. Acoust. Soc. Am* 108(1), pp. 105-116.

Ernst, F.E. et al. (2002), "Removal of scattered guided waves from seismic data," *Geophysics* 67(4), pp. 1240-1248.

Esmersoy, C. (1990), "Inversion of P and SV waves from multicomponent offset vertical seismic profiles", *Geophysics* 55(1), pp. 39-50.

Fichtner, A. et al. (2006), "The adjoint method in seismology I. Theory," *Physics of the Earth and Planetary Interiors* 157, pp. 86-104.

Forbriger, T. (2003), "Inversion of shallow-seismic wavefields: I. Wavefield transformation," *Geophys. J Int.* 153, pp. 719-734.

Gibson, B. et al. (1984), "Predictive deconvolution and the zero-phase source," *Geophysics* 49(4), pp. 379-397.

Griewank, A. (1992), "Achieving logarithmic growth of temporal and spatial complexity in reverse automatic differentiation," 1 *Optimization Methods and Software*, pp. 35-54.

Griewank, A. et al. (2000), "Algorithm 799: An implementation of checkpointing for the reverse or adjoint mode of computational differentiation," 26 *ACM Transactions on Mathematical Software*, pp. 19-45.

Griewank, A. et al. (1990), "Algorithm 755: A package for the automatic differentiation of algorithms written in C/C++," *ACM Transactions on Mathematical Software* 22(2), pp. 131-167.

Holschneider, J. et al. (2005), "Characterization of dispersive surface waves using continuous wavelet transforms," *Geophys. J. Int.* 163, pp. 463-478.

Jackson, D.R. et al. (1991), "Phase conjugation in underwater acoustics," *J. Acoust. Soc. Am.* 89(1), pp. 171-181.

Kennett, B.L.N. (1991), "The removal of free surface interactions from three-component seismograms", *Geophys. J. Int.* 104, pp. 153-163.

Krebs, J.R, (2009), "Full-wavefield seismic inversion using encoded sources," *Geophysics* 74(6), pp. WCC177-WCC188.

Krohn, C.E. (1984), "Geophone ground coupling," *Geophysics* 49(6), pp. 722-731.

Kulesh, M. et al. (2008), "Modeling of Wave Dispersion Using Continuous Wavelet Transforms II: Wavelet-based Frequency-velocity Analysis," *Pure Applied Geophysics* 165, pp. 255-270.

Lecomte, I. (2008), "Resolution and illumination analyses in PSDM: A ray-based approach," The Leading Edge, pp. 650-663.

Lavanon, N. (1988), "Radar Principles," Chpt. I, John Whiley & Sons, New York, pp. 1-18.

Nazarian, S. et al. (1983), "Use of spectral analysis of surface waves method for determination of moduli and thickness of pavement systems," *Transport Res. Record* 930, pp. 38-45.

Neelamani, R., (2008), "Simultaneous sourcing without compromise," 70th Annual Int'l. Conf. and Exh., EAGE, 5 pgs.

Plessix, R.E. et al. (2004), "Frequency-domain finite-difference amplitude preserving migration," *Geophys. J. Int.* 157, pp. 975-987.

Park, C.B. et al. (1999), "Multichannel analysis of surface waves," *Geophysics* 64(3), pp. 800-808.

Porter, R.P. (1989), "Generalized holography with application to inverse scattering and inverse source problems," In E. Wolf, editor, Progress in Optics XXVII, Elsevier, pp. 317-397.

Pratt, R.G. et al. (1998), "Gauss-Newton and full Newton methods in frequency-space seismic waveform inversion," *Geophys. J. Int.* 133, pp. 341-362.

Rayleigh, J.W.S. (1899), "On the transmission of light through an atmosphere containing small particles in suspension, and on the origin of the blue sky," *Phil. Mag.* 47, pp. 375-384.

Ryden, N. et al. (2006), "Fast simulated annealing inversion of surface waves on pavement using phase-velocity spectra," *Geophysics* 71(4), pp. R49-R58.

Shin, C. et al. (2001), "Waveform inversion using a logarithmic wavefield," *Geophysics* 49, pp. 592-606.

Trantham, E.C. (1994), "Controlled-phase acquisition and processing," *SEG Expanded Abstracts* 13, pp. 890-894.

Xia, J. et al. (2004), "Utilization of high-frequency Rayleigh waves in near-surface geophysics," *The Leading Edge*, pp. 753-759.

Ziolkowski, A. (1991), "Why don't we measure seismic signatures?," *Geophysics* 56(2), pp. 190-201.

Ridzal, d. et al. (2011), "Application of Random Projection of Parameter Estimation," SIAM Optimization, Darmstadt, May 17, 2011, p. 1-15.

Ridzal, d. et al. (2011), "Application of Random Projection of Parameter Estimation," SIAM Optimization, Darmstadt, May 17, 2011, p. 16-20.

Ridzal, d. et al. (2011), "Application of Random Projection of Parameter Estimation," SIAM Optimization, Darmstadt, May 17, 2011, p. 21-25.

Ridzal, d. et al. (2011), "Application of Random Projection of Parameter Estimation," SIAM Optimization, Darmstadt, May 17, 2011, p. 26-30.

Sheriff, R.E.et al. (1982), "*Exploration Seismology*", pp. 134-135.

Tarantola, A. (1988), "Theoretical background for the inversion of seismic, waveforms, including elasticity and attenuation," *Pure and Applied Geophysics* 128, pp. 365-399.

\* cited by examiner

ITERATIVE INVERSION OF DATA FROM SIMULTANEOUS GEOPHYSICAL SOURCES

CROSS-REFERENCE TO RELATED APPLICATIONS

This application is a National Stage entry under 35 U.S.C. 371 of PCT/US2007/019724 that published as WO 2008/042081 and was filed on Sep. 11, 2007 and claims the benefit of U.S. Provisional application 60/847,696 which was filed on Sep. 28, 2006.

FIELD OF THE INVENTION

The invention relates generally to the field of geophysical prospecting, and more particularly to geophysical data processing. Specifically, the invention is a method for inversion of data acquired from multiple geophysical sources such as seismic sources, involving geophysical simulation that computes the data from many simultaneously-active geophysical sources in one execution of the simulation.

BACKGROUND OF THE INVENTION

Geophysical inversion [1,2] attempts to find a model of subsurface properties that optimally explains observed data and satisfies geological and geophysical constraints. There are a large number of well known methods of geophysical inversion. These well known methods fall into one of two categories, iterative inversion and non-iterative inversion. The following are definitions of what is commonly meant by each of the two categories:
   Non-iterative inversion—inversion that is accomplished by assuming some simple background model and updating the model based on the input data. This method does not use the updated model as input to another step of inversion. For the case of seismic data these methods are commonly referred to as imaging, migration, diffraction tomography or Born inversion.
   Iterative inversion—inversion involving repetitious improvement of the subsurface properties model such that a model is found that satisfactorily explains the observed data. If the inversion converges, then the final model will better explain the observed data and will more closely approximate the actual subsurface properties. Iterative inversion usually produces a more accurate model than non-iterative inversion, but is much more expensive to compute.

Two iterative inversion methods commonly employed in geophysics are cost function optimization and series methods. Cost function optimization involves iterative minimization or maximization of the value, with respect to the model M, of a cost function S(M) which is a measure of the misfit between the calculated and observed data (this is also sometimes referred to as the objective function), where the calculated data is simulated with a computer using the current geophysical properties model and the physics governing propagation of the source signal in a medium represented by a given geophysical properties model. The simulation computations may be done by any of several numerical methods including but not limited to finite difference, finite element or ray tracing. Series methods involve inversion by iterative series solution of the scattering equation (Weglein [3]). The solution is written in series form, where each term in the series corresponds to higher orders of scattering. Iterations in this case correspond to adding a higher order term in the series to the solution.

Cost function optimization methods are either local or global [4]. Global methods simply involve computing the cost function S(M) for a population of models $\{M_1, M_2, M_3, \ldots\}$ and selecting a set of one or more models from that population that approximately minimize S(M). If further improvement is desired this new selected set of models can then be used as a basis to generate a new population of models that can be again tested relative to the cost function S(M). For global methods each model in the test population can be considered to be an iteration, or at a higher level each set of populations tested can be considered an iteration. Well known global inversion methods include Monte Carlo, simulated annealing, genetic and evolution algorithms.

Local cost function optimization involves:
1. selecting a starting model,
2. computing the gradient of the cost function S(M) with respect to the parameters that describe the model,
3. searching for an updated model that is a perturbation of the starting model in the gradient direction that better explains the observed data.

This procedure is iterated by using the new updated model as the starting model for another gradient search. The process continues until an updated model is found which satisfactorily explains the observed data. Commonly used local cost function inversion methods include gradient search, conjugate gradients and Newton's method.

As discussed above, iterative inversion is preferred over non-iterative inversion, because it yields more accurate subsurface parameter models. Unfortunately, iterative inversion is so computationally expensive that it is impractical to apply it to many problems of interest. This high computational expense is the result of the fact that all inversion techniques require many compute intensive forward and/or reverse simulations. Forward simulation means computation of the data forward in time, and reverse simulation means computation of the data backward in time. The compute time of any individual simulation is proportional to the number of sources to be inverted, and typically there are large numbers of sources in geophysical data. The problem is exacerbated for iterative inversion, because the number of simulations that must be computed is proportional to the number of iterations in the inversion, and the number of iterations required is typically on the order of hundreds to thousands.

The compute cost of all categories of inversion can be reduced by inverting data from combinations of the sources, rather than inverting the sources individually. This may be called simultaneous source inversion. Several types of source combination are known including: coherently sum closely spaced sources to produce an effective source that produces a wavefront of some desired shape (e.g. a plane wave), sum widely spaces sources, or fully or partially stacking the data before inversion.

The compute cost reduction gained by inverting combined sources is at least partly offset by the fact that inversion of the combined data usually produces a less accurate inverted model. This loss in accuracy is due to the fact that information is lost when the individual sources are summed, and therefore the summed data does not constrain the inverted model as strongly as the unsummed data. This loss of information during summation can be minimized by encoding each shot record before summing. Encoding before combination preserves significantly more information in the simultaneous source data, and therefore better constrains the inversion. Encoding also allows combination of closely spaced sources, thus allowing more sources to be combined for a given computational region. Various encoding schemes can be used with this technique including time shift encoding and random phase encoding. The remainder of this Background section briefly reviews various published geophysical simultaneous source techniques, both encoded and non-encoded.

Van Manen [5] suggests using the seismic interferometry method to speedup forward simulation. Seismic interferometry works by placing sources everywhere on the boundary of the region of interest. These sources are modeled individually and the wavefield at all locations for which a Green's function is desired is recorded. The Green's function between any two recorded locations can then be computed by cross-correlating the traces acquired at the two recorded locations and summing over all the boundary sources. If the data to be inverted has a large number of sources and receivers that are within the region of interest (as opposed to having one or the other on the boundary) then this is a very efficient method for computing the desired Green's functions. However, for the seismic data case it is rare that both the source and receiver for the data to be inverted are within the region of interest. Therefore, this improvement has very limited applicability to the seismic inversion problem.

Berkhout [6] and Zhang [7] suggest that inversion in general can be improved by inverting non-encoded simultaneous sources that are summed coherently to produce some desired wave front within some region of the subsurface. For example point source data could be summed with time shifts that are a linear function of the source location to produce a downgoing plane wave at some particular angle with respect to the surface. This technique could be applied to all categories of inversion. A problem with this method is that coherent summation of the source gathers necessarily reduces the amount of information in the data. So for example, summation to produce a plane wave removes all the information in the seismic data related to travel time versus source-receiver offset. This information is critical for updating the slowly varying background velocity model, and therefore Berkhout's method is not well constrained. To overcome this problem many different coherent sums of the data (e.g. many plane waves with different propagation directions) could be inverted, but then efficiency is lost since the cost of inversion is proportional to the number of different sums inverted. Such coherently summed sources are called generalized sources. Therefore, a generalized source can either be a point source or a sum of point sources that produces a wave front of some desired shape.

Van Riel [8] suggests inversion by non-encoded stacking or partial stacking (with respect to source-receiver offset) of the input seismic data, then defining a cost function with respect to this stacked data which will be optimized. Thus, this publication suggests improving cost function based inversion using non-encoded simultaneous sources. As was true of the Berkhout's [6] simultaneous source inversion method, the stacking suggested by this method reduces the amount of information in the data to be inverted and therefore the inversion is less well constrained than it would have been with the original data.

Mora [9] proposes inverting data that is the sum of widely spaced sources. Thus, this publication suggests improving the efficiency of inversion using non-encoded simultaneous source simulation. Summing widely spaced sources has the advantage of preserving much more information than the coherent sum proposed by Berkhout. However, summation of widely spaced sources implies that the aperture (model region inverted) that must be used in the inversion must be increased to accommodate all the widely spaced sources. Since the compute time is proportional to the area of this aperture, Mora's method does not produce as much efficiency gain as could be achieved if the summed sources were near each other.

Ober [10] suggests speeding up seismic migration, a special case of non-iterative inversion, by using simultaneous encoded sources. After testing various coding methods, Ober found that the resulting migrated images had significantly reduced signal-to-noise ratio due to the fact that broad band encoding functions are necessarily only approximately orthogonal. Thus, when summing more than 16 shots, the quality of the inversion was not satisfactory. Since non-iterative inversion is not very costly to begin with, and since high signal-to-noise ratio inversion is desired, this technique is not widely practiced in the geophysical industry.

Ikelle [11] suggests a method for fast forward simulation by simultaneously simulating point sources that are activated (in the simulation) at varying time intervals. A method is also discussed for decoding these time-shifted simultaneous-source simulated data back into the separate simulations that would have been obtained from the individual point sources. These decoded data could then be used as part of any conventional inversion procedure. A problem with Ikelle's method is that the proposed decoding method will produce separated data having noise levels proportional to the difference between data from adjacent sources. This noise will become significant for subsurface models that are not laterally constant, for example from models containing dipping reflectors. Furthermore, this noise will grow in proportion to the number of simultaneous sources. Due to these difficulties Ikelle's simultaneous source approach may result in unacceptable levels of noise if used in inverting a subsurface that is not laterally constant.

What is needed is a more efficient method of iteratively inverting data, without significant reduction in the accuracy of the resulting inversion.

SUMMARY OF THE INVENTION

A physical properties model gives one or more subsurface properties as a function of location in a region. Seismic wave velocity is one such physical property, but so are (for example) p-wave velocity, shear wave velocity, several anisotropy parameters, attenuation (q) parameters, porosity, permeability, and resistivity. Referring to the flow chart of FIG. 10, in one embodiment the invention is a computer-implemented method for inversion of measured geophysical data to determine a physical properties model for a subsurface region, comprising:

(a) obtaining a group of two or more encoded gathers of the measured geophysical data, wherein each gather is associated with a single generalized source or, using source-receiver reciprocity, with a single receiver, and wherein each gather is encoded with a different encoding signature selected from a set non-equivalent encoding signatures;

(b) summing (4) the encoded gathers in the group by summing all data records in each gather that correspond to a single receiver (or source if reciprocity is used), and repeating for each different receiver, resulting in a simultaneous encoded gather;

(c) assuming a physical properties model 5 of the subsurface region, said model providing values of at least one physical property at locations throughout the subsurface region;

(d) calculating an update 6 to the assumed physical properties model that is more consistent with the simultaneous encoded gather from step (b), said calculation involving one or more encoded simultaneous source forward (or reverse) simulation operations that use the assumed physical properties model and encoded source signatures using the same encoding functions used to encode corresponding gathers of measured data, wherein an entire simultaneous encoded gather is simulated in a single simulation operation;

(e) repeating step (d) at least one more iteration, using the updated physical properties model from the previous iteration of step (d) as the assumed model to produce a further updated physical properties model 7 of the subsurface region that is more consistent with a corresponding simultaneous encoded gather of measured data, using the same encoding signatures for source signatures in the simulation as were used in forming the corresponding simultaneous encoded gather of measured data; and (f) downloading the further updated physical properties model or saving it to computer storage.

It may be desirable in order to maintain inversion quality or for other reasons to perform the simultaneous encoded-source simulations in step (b) in more than one group. In such case, steps (a)-(b) are repeated for each additional group, and inverted physical properties models from each group are accumulated before performing the model update in step (d). If the encoded gathers are not obtained already encoded from the geophysical survey as described below, then gathers of geophysical data 1 are encoded by applying encoding signatures 3 selected from a set of non-equivalent encoding signatures 2.

In another embodiment, the present invention is a computer-implemented method for inversion of measured geophysical data to determine a physical properties model for a subsurface region, comprising:

(a) obtaining a group of two or more encoded gathers of the measured geophysical data, wherein each gather is associated with a single generalized source or, using source-receiver reciprocity, with a single receiver, and wherein each gather is encoded with a different encoding signature selected from a set non-equivalent encoding signatures;

(b) summing the encoded gathers in the group by summing all data records in each gather that correspond to a single receiver (or source if reciprocity is used), and repeating for each different receiver, resulting in a simultaneous encoded gather;

(c) assuming a physical properties model of the subsurface region, said model providing values of at least one physical property at locations throughout the subsurface region;

(d) simulating a synthetic simultaneous encoded gather corresponding to the simultaneous encoded gather of measured data, using the assumed physical properties model, wherein the simulation uses encoded source signatures using the same encoding functions used to encode the simultaneous encoded gather of measured data, wherein an entire simultaneous encoded gather is simulated in a single simulation operation;

(e) computing a cost function measuring degree of misfit between the simultaneous encoded gather of measured data and the simulated simultaneous encoded gather;

(f) repeating steps (a), (b), (d) and (e) for at least one more cycle, accumulating costs from step (e);

(g) updating the physical properties model by optimizing the accumulated costs;

(h) iterating steps (a)-(g) at least one more time using the updated physical properties model from the previous iteration as the assumed physical properties model in step (c), wherein a different set non-equivalent encoding signatures may be used for each iteration, resulting in a further updated physical properties model; and (i) downloading the further updated physical properties model or saving it to computer storage.

In another embodiment, the invention is a computer-implemented method for inversion of measured geophysical data to determine a physical properties model for a subsurface region, comprising:

(a) obtaining a group of two or more encoded gathers of the measured geophysical data, wherein each gather is associated with a single generalized source or, using source-receiver reciprocity, with a single receiver, and wherein each gather is encoded with a different encoding signature selected from a set non-equivalent encoding signatures;

(b) summing the encoded gathers in the group by summing all data records in each gather that correspond to a single receiver (or source if reciprocity is used), and repeating for each different receiver, resulting in a simultaneous encoded gather;

(c) assuming a physical properties model of the subsurface region, said model providing values of at least one physical property at locations throughout the subsurface region;

(d) selecting an iterative series solution to a scattering equation describing wave scattering in said subsurface region;

(e) beginning with the first n terms of said series, where $n \geq 1$, said first n terms corresponding to the assumed physical properties model of the subsurface region;

(f) computing the next term in the series, said calculation involving one or more encoded simultaneous source forward (or reverse) simulation operations that use the assumed physical properties model and encoded source signatures using the same encoding functions used to encode corresponding gathers of measured data, wherein an entire simultaneous encoded gather is simulated in a single simulation operation and the simulated encoded gather and measured encoded gather are combined in a manner consistent with the iterative series selected in step (d);

(g) updating the model by adding the next term in the series calculated in step (f) to the assumed model;

(h) repeating steps (f) and (g) for at least one time to add at least one more term to the series to further update the physical properties model; and (i) downloading the further updated physical properties model or saving it to computer storage.

In another embodiment, the invention is a computer-implemented method for inversion of measured geophysical data to determine a physical properties model for a subsurface region, comprising:

(a) obtaining measured geophysical data from a geophysical survey the subsurface region;

(b) assuming an initial physical properties model and inverting it by iterative inversion involving simultaneous simulation of survey data representing a plurality of survey sources (or receivers if source-receiver reciprocity is used) wherein source signatures in the simulation are encoded, resulting in a simulated simultaneous encoded gather of geophysical data, the inversion process involving updating the physical properties model to reduce misfit between the simulated simultaneous encoded gather and a corresponding simultaneous encoded gather formed by summing gathers of measured survey data encoded with the same encoding functions used in the simulation; and (c) downloading the updated physical properties model or saving it to computer storage.

BRIEF DESCRIPTION OF THE DRAWINGS

The present invention and its advantages will be better understood by referring to the following detailed description and the attached drawings in which.

Figure 1:
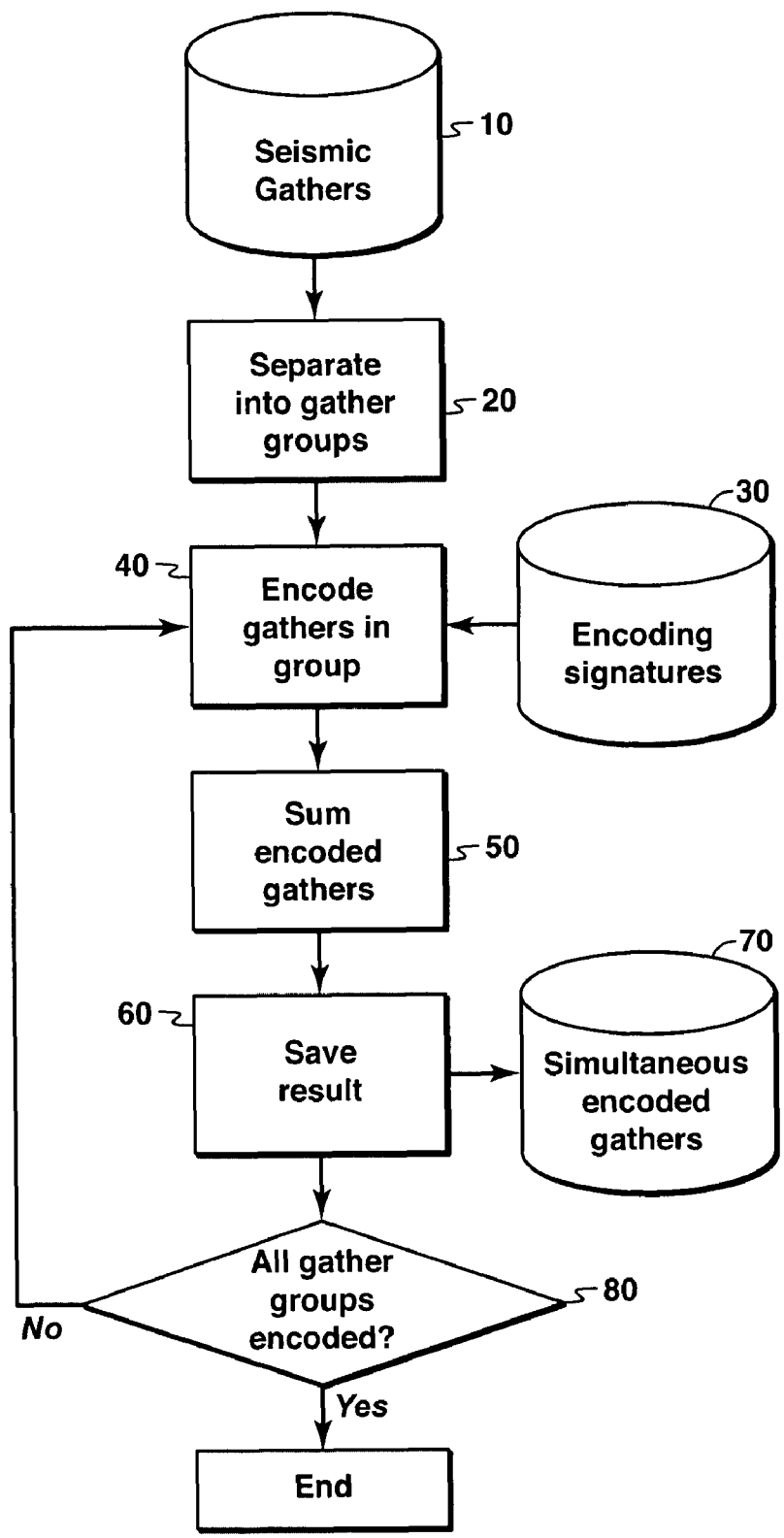
FIG. 1 is a flow chart showing steps in a method for preparing data for simultaneous encoded-source inversion.

The invention will be described in connection with its preferred embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF PREFERRED EMBODIMENTS

The present invention is a method for reducing the computational time needed to iteratively invert geophysical data by use of simultaneous encoded-source simulation.

Geophysical inversion attempts to find a model of subsurface elastic properties that optimally explains observed geophysical data. The example of seismic data is used throughout to illustrate the inventive method, but the method may be advantageously applied to any method of geophysical prospecting involving at least one source, activated at multiple locations, and at least one receiver. The data inversion is most accurately performed using iterative methods. Unfortunately iterative inversion is often prohibitively expensive computationally. The majority of compute time in iterative inversion is spent computing forward and/or reverse simulations of the geophysical data (here forward means forward in time and reverse means backward in time). The high cost of these simulations is partly due to the fact that each geophysical source in the input data must be computed in a separate computer run of the simulation software. Thus, the cost of simulation is proportional to the number of sources in the geophysical data (typically on the order of 1,000 to 10,000 sources for a geophysical survey). In this invention, the source signatures for a group of sources are encoded and these encoded sources are simulated in a single run of the software, resulting in a computational speedup proportional to the number of sources computed simultaneously.

As discussed above in the Background section, simultaneous source methods have been proposed in several publications for reducing the cost of various processes for inversion of geophysical data [3, 6, 7, 8, 9]. In a more limited number of cases, simultaneous encoded-source techniques are disclosed for certain purposes [10, 11]. These methods have all been shown to provide increased efficiency, but always at significant cost in reduced quality, usually in the form of lower signal-to-noise ratio when large numbers of simultaneous sources are employed. The present invention mitigates this inversion quality reduction by showing that simultaneous encoded-source simulation can be advantageously used in connection with iterative inversion. Iteration has the surprising effect of reducing the undesirable noise resulting from the use of simultaneous encoded sources. This is considered unexpected in light of the common belief that inversion requires input data of the highest possible quality. In essence, the simultaneous encoded-source technique produces simulated data that appear to be significantly degraded relative to single source simulation (due to the data encoding and summation which has the appearance of randomizing the data), and uses this apparently degraded data to produce an inversion that has, as will be shown below, virtually the same quality as the result that would have been obtained by the prohibitively expensive process of inverting the data from the individual sources. (Each source position in a survey is considered a different "source" for purposes of inversion.)

The reason that these apparently degraded data can be used to perform a high quality iterative inversion is that by encoding the data before summation of sources the information content of the data is only slightly degraded. Since there is only insignificant information loss, these visually degraded data constrain an iterative inversion just as well as conventional sequential source data. Since simultaneous sources are used in the simulation steps of the inversion, the compute time is significantly reduced, relative to conventional sequential source inversion.

Two iterative inversion methods commonly employed in geophysics are cost function optimization and series methods. The present invention can be applied to both of these methods. Simultaneous encoded-source cost function optimization is discussed first.

Iterative Cost Function Optimization

Cost function optimization is performed by minimizing the value, with respect to a subsurface model M, of a cost function S(M) (sometimes referred to as an objective function), which is a measure of misfit between the observed (measured) geophysical data and corresponding data calculated by simulation of the assumed model. A simple cost function S often used in geophysical inversion is:

$$S(M) = \sum_{g=1}^{N_g} \sum_{r=1}^{N_r} \sum_{t=1}^{N_t} |\psi_{calc}(M, g, r, t, w_g) - \psi_{obs}(g, r, t, w_g)|^N. \quad (1)$$

where
N=norm for cost function (typically the least squares or L2-Norm is used in which case N=2),
M=subsurface model,
g=gather index (for point source data this would correspond to the individual sources),
$N_g$=number of gathers,
r=receiver index within gather,
$N_r$=number of receivers in a gather,
t=time sample index within a data record,
$N_t$=number of time samples,
$\psi_{calc}$=calculated geophysical data from the model M, $\psi_{obs}$=measured geophysical data, and $w_g$=source signature for gather g, i.e. source signal without earth filtering effects.

The gathers in Equation 1 can be any type of gather that can be simulated in one run of a forward modeling program. For seismic data, the gathers correspond to a seismic shot, although the shots can be more general than point sources [6]. For point sources, the gather index g corresponds to the location of individual point sources. For plane wave sources, g would correspond to different plane wave propagation directions. This generalized source data, $\psi_{obs}$, can either be acquired in the field or can be synthesized from data acquired using point sources. The calculated data $\psi_{calc}$ on the other hand can usually be computed directly by using a generalized source function when forward modeling (e.g. for seismic data, forward modeling typically means solution of the anisotropic visco-elastic wave propagation equation or some approximation thereof). For many types of forward modeling, including finite difference modeling, the computation time needed for a generalized source is roughly equal to the computation time needed for a point source. The model M is a model of one or more physical properties of the subsurface region. Seismic wave velocity is one such physical property, but so are (for example) p-wave velocity, shear wave velocity, several anisotropy parameters, attenuation (q) parameters, porosity, and permeability. The model M might represent a single physical property or it might contain many different parameters depending upon the level of sophistication of the inversion. Typically, a subsurface region is subdivided into discrete cells, each cell being characterized by a single value of each parameter.

Equation 1 can be simplified to:

$$S(M) = \sum_{g=1}^{N_g} |\delta(M, g, w_g)|^N \quad (2)$$

where the sum over receivers and time samples is now implied and, $$\delta(M,g,w_g)=\psi_{calc}(M,g,w_g)-\psi_{obs}(g,w_g) \quad (3)$$

One major problem with iterative inversion is that computing $\psi_{calc}$ takes a large amount of computer time, and therefore computation of the cost function, S, is very time consuming. Furthermore, in a typical inversion project this cost function must be computed for many different models M.

The computation time for $\psi_{calc}$ is proportional to the number of gathers (for point source data this equals the number of sources), $N_g$, which is on the order of 10,000 to 100,000 for a typical seismic survey. The present invention greatly reduces the time needed for geophysical inversion by showing that S(M) can be well approximated by computing $\psi_{calc}$ for many encoded generalized sources which are activated simultaneously. This reduces the time needed to compute $\psi_{calc}$ by a factor equal to the number of simultaneous sources. A more detailed version of the preceding description of the technical problem being addressed follows.

The cost function in Equation 2 is replaced with the following:

$$S_{sim}(M) = \sum_{G=1}^{N_G} \left| \sum_{g \in G} \delta(M, g, c_g \otimes w_g) \right|^N \quad (5)$$

where a summation over receivers and time samples is implied as in Equation 2 and:

$$\sum_{g=1}^{N_g} = \sum_{G=1}^{N_G} \sum_{g \in G} \text{ defines a sum over gathers by sub groups of gathers,}$$

$S_{sim}$=cost function for simultaneous source data,
G=the groups of simultaneous generalized sources, and
$N_G$=the number of groups,
$c_G$=functions of time that are convolved ($\otimes$) with each gather's source signature to encode the gathers, these encoding functions are chosen to be different, i.e. non-equivalent, for each gather index g (e.g. different realizations of random phase functions).

The outer summation in Equation 5 is over groups of simultaneous generalized sources corresponding to the gather type (e.g. point sources for common shot gathers). The inner summation, over g, is over the gathers that are grouped for simultaneous computation. For some simulation methods, such as finite difference modeling, the computation of the model for summed sources (the inner sum over g∈G) can be performed in the same amount of time as the computation for a single source. Thus, Equation 5 can be computed in a time that is $N_g/N_G$ times faster than Equation 2. In the limiting case, all gathers are computed simultaneously (i.e. G contains all $N_g$ sources and $N_G$=1) and one achieves a factor of $N_g$ speedup.

This speedup comes at the cost that $S_{sim}(M)$ in Equation 5 is not in general as suitable a cost function for inversion as is S(M) defined in Equation 2. Two requirements for a high quality cost function are:
1. It has a global minimum when the model M is close to the true subsurface model,
2. It has few local minima and they are located far from the true subsurface model.

It is easy to see that in the noise-free case the global minimum of both S(M) and $S_{sim}(M)$ will occur when M is equal to the true subsurface model and that their value at the global minimum is zero. Experience has shown that the global minimum of $S_{sim}(M)$ is also close to the actual subsurface model in the case where the data are noisy. Thus, $S_{sim}(M)$ satisfies requirement number 1 above. Next it will be shown how $S_{sim}(M)$ can be made to satisfy the second enumerated requirement.

One cannot in general develop a cost function for data inversion that has no local minima. So it would be unreasonable to expect $S_{sim}(M)$ to have no local minima as desired by requirement 2 above. However, it is at least desirable that $S_{sim}(M)$ has a local minima structure not much worse than S(M). According to the present invention, this can be accomplished by a proper choice of encoding signatures.

When the cost function uses an L2-Norm, choosing the encoding signatures to be random phase functions gives a simultaneous source cost function that has a local minima structure similar to the sequential source cost function. This can be seen by developing a relationship between $S_{sim}(M)$ to S(M) as follows. First, Equation 5 is specialized to the L2-Norm case:

$$S_{sim}(M) = \sum_{G=1}^{N_G} \left| \sum_{g \in G} \delta(M, g, c_g \otimes w_g) \right|^2 \quad (6)$$

The square within the sum over groups can be expanded as follows:

$$S_{sim}(M) = \sum_{G=1}^{N_G} \left( \begin{array}{c} \sum_{g \in G} |\delta(M, g, c_g \otimes w_g)|^2 + \\ \sum_{\substack{g,g' \in G \\ g \neq g'}} |\delta(M, g, c_g \otimes w_g)||\delta(M, g', c_{g'} \otimes w_{g'})| \end{array} \right) \quad (7)$$

By choosing the $c_g$ so that they have constant amplitude spectra, the first term in Equation 7 is simply S(M), yielding:

$$S_{sim}(M) = S(M) + \sum_{G=1}^{N_G} \sum_{\substack{g \in G \\ g' \in G \\ g' \neq g}} |\delta(M, g, c_g \otimes w_g)||\delta(M, g', c_{g'} \otimes w_{g'})| \quad (8)$$

Equation 8 reveals that $S_{sim}(M)$ is equal S(M) plus some cross terms. Note that due to the implied sum over time samples, the cross terms $|\delta(M,g,c_g \otimes w_g)||\delta(M,g', c_{g'} \otimes w_{g'})|$ are really cross correlations of the residual from two different gathers. This cross correlation noise can be spread out over the model by choosing the encoding functions $c_g$ such that $c_g$ and $c_{g'}$ are different realizations of random phase functions. Other types of encoding signatures may also work. Thus, with this choice of the $c_g$, $S_{sim}(M)$ is approximately equal to S(M). Therefore, the local minima structure of $S_{sim}(M)$ is approximately equal to S(M).

Figure 2:
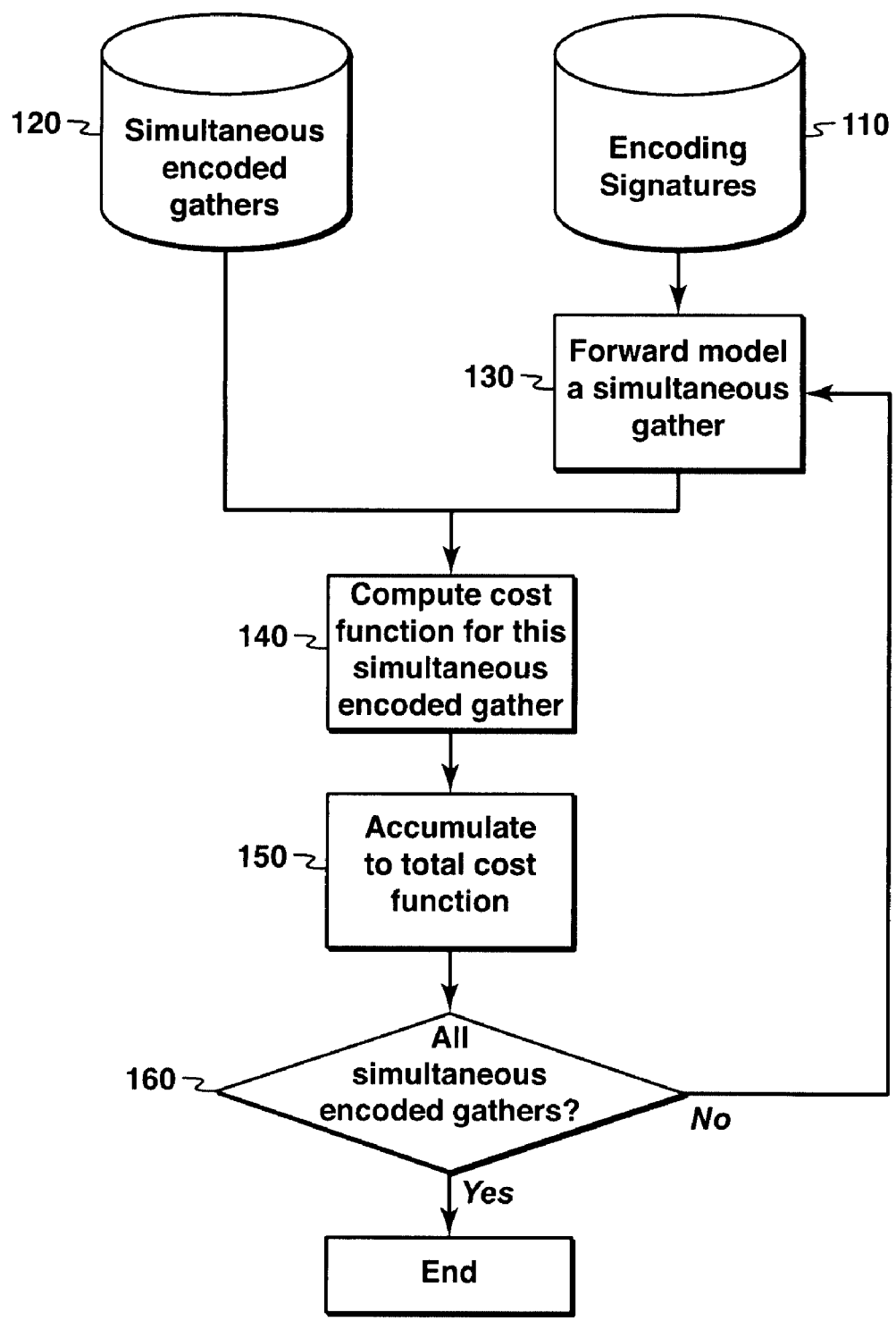
FIG. 2 is a flow chart showing steps in one embodiment of the present inventive method for simultaneous source computation of the data inversion cost function.

In practice, the present invention can be implemented according to the flow charts shown in FIGS. 1 and 2. The flow chart in FIG. 1 may be followed to encode and sum the geophysical survey data to be inverted to form simultaneous gather data. In step 20, the input data 10 are separated into groups of gathers that will be encoded and summed to form simultaneous encoded gathers. In step 40, each gather in one of the gather groups from step 20 are encoded. This encoding is performed by selecting a gather from the gather group and selecting an encoding signature from the set of non-equivalent encoding signatures 30. All the traces from the gather are then temporally convolved with that selected encoding signature. Each gather in the gather group is encoded in the same manner, choosing a different encoding signature from 30 for each gather. After all gathers have been encoded in 40, all the gathers are summed in 50. The gathers are summed by summing all traces corresponding to the same receiver from each gather. This forms a simultaneous encoded-source gather which is then saved in step 60 to the output set of simulated simultaneous encoded gathers 70. At step 80, steps 40-60 are typically repeated until all gather groups from step 20 have been encoded. When all gather groups have been encoded, this process is ended and the file containing the simultaneous encoded gathers 70 will contain one simultaneous encoded gather for each gather group formed in step 20. How many gathers to put in a single group is a matter of judgment. The considerations involved include quality of the cost function vs. speedup in inversion time. One can run tests like those in the examples section below, and ensure that the grouping yields a high quality cost function. In some instances, it may be preferable to sum all the gathers into one simultaneous gather, i.e., use a single group.

FIG. 1 describes how simultaneous encoded gathers are obtained in some embodiments of the invention. In other embodiments, the geophysical data are acquired from simultaneous encoded sources, eliminating the need for the process in FIG. 1. It may be noted that acquiring simultaneous encoded-source data in the field could significantly reduce the cost of acquiring the geophysical data and also could increase the signal-to-noise ratio relative to ambient noise. Thus the present invention may be advantageously applied to (using a seismic vibrator survey as the example) a single vibrator truck moved sequentially to multiple locations, or to a survey in which two or more vibrator trucks are operating simultaneously with different encoded sweeps in close enough proximity that the survey receivers record combined responses of all vibrators. In the latter case only, the data could be encoded in the field.

FIG. 2 is a flowchart showing basic steps in the present inventive method for computing the data inversion cost function for the simultaneous encoded-source data. The simultaneous encoded gathers 120 are preferably either the data formed at 70 of FIG. 1 or are simultaneous encoded gathers that were acquired in the field. In step 130, a simultaneous encoded gather from 120 is forward modeled using the appropriate signatures from the set of encoding signatures 110 that were used to form the simultaneous encoded gathers 120. In step 140, the cost function for this simultaneous encoded gather is computed. If the cost function is the L2 norm cost function, then step 140 would constitute summing, over all receivers and all time samples, the square of the difference between the simultaneous encoded gather from 120 and the forward modeled simultaneous encoded gather from 130. The cost value computed in 140 is then accumulated into the total cost in step 150. Steps 130-150 are typically repeated for another simultaneous encoded gather from 120, and that cycle is repeated until all desired simultaneous encoded gathers from 120 have been processed (160).

There are many techniques for inverting data. Most of these techniques require computation of a cost function, and the cost functions computed by this invention provide a much more efficient method of performing this computation. Many types of encoding functions $c_g$ can be used to ensure that $S_{sim}(M)$ is approximately equal to S(M) including but not limited to:

Linear, random, chirp and modified chirp frequency dependent phase encoding as presented in Romero et al. [12];
The frequency independent phase encoding as presented in Jing et al. [13];
Random time shift encoding.

Some of these encoding techniques will work better than others depending upon the application, and some can be combined. In particular, good results have been obtained using frequency dependent random phase encoding and also by combining frequency independent encoding of nearby sources with frequency dependent random phase encoding for more widely separated sources. An indication of the relative merits of different encodings can be obtained by running test inversions with each set of encoding functions to determine which converges faster.

It should be noted that the simultaneous encoded-source technique can be used for many types of inversion cost function. In particular it could be used for cost functions based on other norms than L2 discussed above. It could also be used on more sophisticated cost functions than the one presented in Equation 2, including regularized cost functions. Finally, the simultaneous encoded-source method could be used with any type of global or local cost function inversion method including Monte Carlo, simulated annealing, genetic algorithm, evolution algorithm, gradient line search, conjugate gradients and Newton's method.

Iterative Series Inversion

Besides cost function optimization, geophysical inversion can also be implemented using iterative series methods. A common method for doing this is to iterate the Lippmann-Schwinger equation [3]. The Lippmann-Schwinger equation describes scattering of waves in a medium represented by a physical properties model of interest as a perturbation of a simpler model. The equation is the basis for a series expansion that is used to determine scattering of waves from the model of interest, with the advantage that the series only requires calculations to be performed in the simpler model. This series can also be inverted to form an iterative series that allows the determination of the model of interest, from the measured data and again only requiring calculations to be performed in the simpler model. The Lippmann-Schwinger equation is a general formalism that can be applied to all types of geophysical data and models, including seismic waves. This method begins with the two equations:

$$LG = -I \quad (9)$$

$$L_0 G_0 = -I \quad (10)$$

where $L$, $L_0$ are the actual and reference differential operators, $G$ and $G_0$ are the actual and reference Green's operators respectively and $I$ is the unit operator. Note that $G$ is the measured point source data, and $G_0$ is the simulated point source data from the initial model. The Lippmann-Schwinger equation for scattering theory is:

$$G = G_0 + G_0 V G \quad (11)$$

where $V = L - L_0$ from which the difference between the true and initial models can be extracted.

Equation 11 is solved iteratively for V by first expanding it in a series (assuming $G = G_0$ for the first approximation of $G$ and so forth) to get:

$$G = G_0 + G_0 V G_0 + G_0 V G_0 V G_0 + \quad (12)$$

Then V is expanded as a series:

$$V = V^{(1)} + V^{(2)} + V^{(3)} + \quad (13)$$

where $V^{(n)}$ is the portion of V that is $n^{th}$ order in the residual of the data (here the residual of the data is $G - G_0$ measured at the surface). Substituting Equation 13 into Equation 12 and collecting terms of the same order yields the following set of equations for the first 3 orders:

$$G - G_0 = G_0 V^{(1)} G_0 \quad (14)$$

$$0 = G_0 V^{(2)} G_0 + G_0 V^{(1)} G_0 V^{(1)} G_0 \quad (15)$$

$$0 = G_0 V^{(3)} G_0 + G_0 V^{(1)} G_0 V^{(2)} G_0 + G_0 V^{(2)} G_0 V^{(1)} G_0 + G_0 V^{(1)} G_0 V^{(1)} G_0 V^{(1)} G_0 \quad (16)$$

and similarly for higher orders in V. These equations may be solved iteratively by first solving Equation 14 for $V^{(1)}$ by inverting $G_0$ on both sides of $V^{(1)}$ to yield:

$$V^{(1)} = G_0^{-1}(G - G_0) G_0^{-1} \quad (17)$$

$V^{(1)}$ from Equation 17 is then substituted into Equation 15 and this equation is solved for $V^{(2)}$ to yield:

$$V^{(2)} = -G_0^{-1} G_0 V^{(1)} G_0 V^{(1)} G_0 G_0^{-1} \quad (18)$$

and so forth for higher orders of V.

Equation 17 involves a sum over sources and frequency which can be written out explicitly as:

$$V^{(1)} = \sum_\omega \sum_s G_0^{-1} (G_s - G_{0s}) G_{0s}^{-1} \quad (17)$$

where $G_s$ is the measured data for source s, $G_{0s}$ is the simulated data through the reference model for source s and $G_{0s}^{-1}$ can be interpreted as the downward extrapolated source signature from source s. Equation 17 when implemented in the frequency domain can be interpreted as follows: (1) Downward extrapolate through the reference model the source signature for each source (the $G_{0s}^{-1}$ term), (2) For each source, downward extrapolate the receivers of the residual data through the reference model (the $G_0^{-1}(G_s - G_{0s})$ term), (3) multiply these two fields then sum over all sources and frequencies. The downward extrapolations in this recipe can be carried out using geophysical simulation software, for example using finite differences.

The simultaneous encoded-source technique can be applied to Equation 17 as follows:

$$\tilde{V}^{(1)} = \sum_\omega G_0^{-1} \left[ \sum_s e^{i\phi_s(\omega)} G_s - \sum_s e^{i\phi_s(\omega)} G_{0s} \right] \left[ \sum_{s'} (e^{i\phi_{s'}(\omega)} G_{0s'})^{-1} \right] \quad (18)$$

where a choice has been made to encode by applying the phase function $\phi_s(\omega)$ which depends on the source and may depend on the frequency $\omega$. As was the case for Equation 17, Equation 18 can be implemented by: (1) Encoding and summing the measured data (the first summation in brackets), (2) Forward simulating the data that would be acquired from simultaneous encoded sources using the same encoding as in step 1 (the second term in the brackets, (3) Subtract the result for step 2 from the result from step 1, (4) Downward extrapolate the data computed in step 3 (the first $G_0^{-1}$ term applied to the bracketed term), (5) Downward extrapolate the simultaneous encoded sources encoded with the same encoding as in step 1, (6) Multiply these two fields and sum over all frequencies. Note that in this recipe the simulations are all performed only once for the entire set of simultaneous encoded sources, as opposed to once for each source as was the case for Equation 17. Thus, Equation 18 requires much less compute time than Equation 17.

Separating the summations over s and s' into portions where $s=s'$ and $s \neq s'$ in Equation 18 gives:

$$\tilde{V}^{(1)} = \sum_\omega \sum_s G_0^{-1} (G_s - G_{0s}) G_{0s}^{-1} + \sum_\omega G_0^{-1} \sum_s \sum_{s' \neq s} e^{i\phi_s(\omega)} e^{-i\phi_{s'}(\omega)} (G_s - G_{0s}) G_{0s'}^{-1}. \quad (19)$$

The first term in Equation 19 may be recognized as Equation 17 and therefore:

$$\tilde{V}^{(1)} = V^{(1)} + \text{crossterms} \quad (20)$$

The cross terms in Equation 19 will be small if $\phi_s \neq \phi_{s'}$ when $s \neq s'$. Thus, as was the case for cost function optimization, the simultaneous encoded-source method speeds up computation of the first term of the series and gives a result that is similar to the much more expensive sequential source method. The same simultaneous encoded-source technique can be applied to higher order terms in the series such as the second and third-order terms in Equations 15 and 16.

Further Considerations

The present inventive method can also be used in conjunction with various types of generalized source techniques, such as those suggested by Berkhout [6]. In this case, rather than encoding different point source gather signatures, one would encode the signatures for different synthesized plane waves.

A primary advantage of the present invention is that it allows a larger number of gathers to be computed simultaneously. Furthermore, this efficiency is gained without sacrificing the quality of the cost function. The invention is less subject to noise artifacts than other simultaneous source techniques because the inversion's being iterative implies that the noise artifacts will be greatly suppressed as the global minimum of the cost function is approached.

Some variations on the embodiments described above include:
- The $c_g$ encoding functions can be changed for each computation of the cost function. In at least some instances, using different random phase encodings for each computation of the cost function further reduces the effect of the cross terms in Equation 8.
- In some cases (e.g., when the source sampling is denser than the receiver sampling) it may be advantageous to use reciprocity to treat the actual receivers as computational sources, and encode the receivers instead of the sources.
- This invention is not limited to single-component point receivers. For example, the receivers could be receiver arrays or they could be multi-component receivers.
- The method may be improved by optimizing the encoding to yield the highest quality cost function. For example the encoding functions could be optimized to reduce the number of local minima in the cost function. The encoding functions could be optimized either by manual inspection of tests performed using different encoding functions or using an automated optimization procedure.
- Acquisition of simultaneous encoded-source data could result in significant geophysical data acquisition cost savings.
- For marine seismic data surveys, it would be very efficient to acquire encoded source data from simultaneously operating marine vibrators that operate continuously while in motion.
- Other definitions for the cost function may be used, including the use of a different norm (e.g. L1 norm (absolute value) instead of L2 norm), and additional terms to regularize and stabilize the inversion (e.g. terms that would penalize models that aren't smooth or models that are not sparse).

While the invention includes many embodiments, a typical embodiment might include the following features:
1. The input gathers are common point source gathers.
2. The encoding signatures 30 and 110 are changed between iterations.
3. The encoding signatures 30 and 110 are chosen to be random phase signatures from Romero et. al. [12]. Such a signature can be made simply by making a sequence that consists of time samples which are a uniform pseudo-random sequence.
4. In step 40, the gathers are encoded by convolving each trace in the gather with that gather's encoding signature.
5. In step 130, the forward modeling is performed with a finite difference modeling code in the space-time domain.
6. In step 140, the cost function is computed using an L2 norm.

Examples

Figure 3:
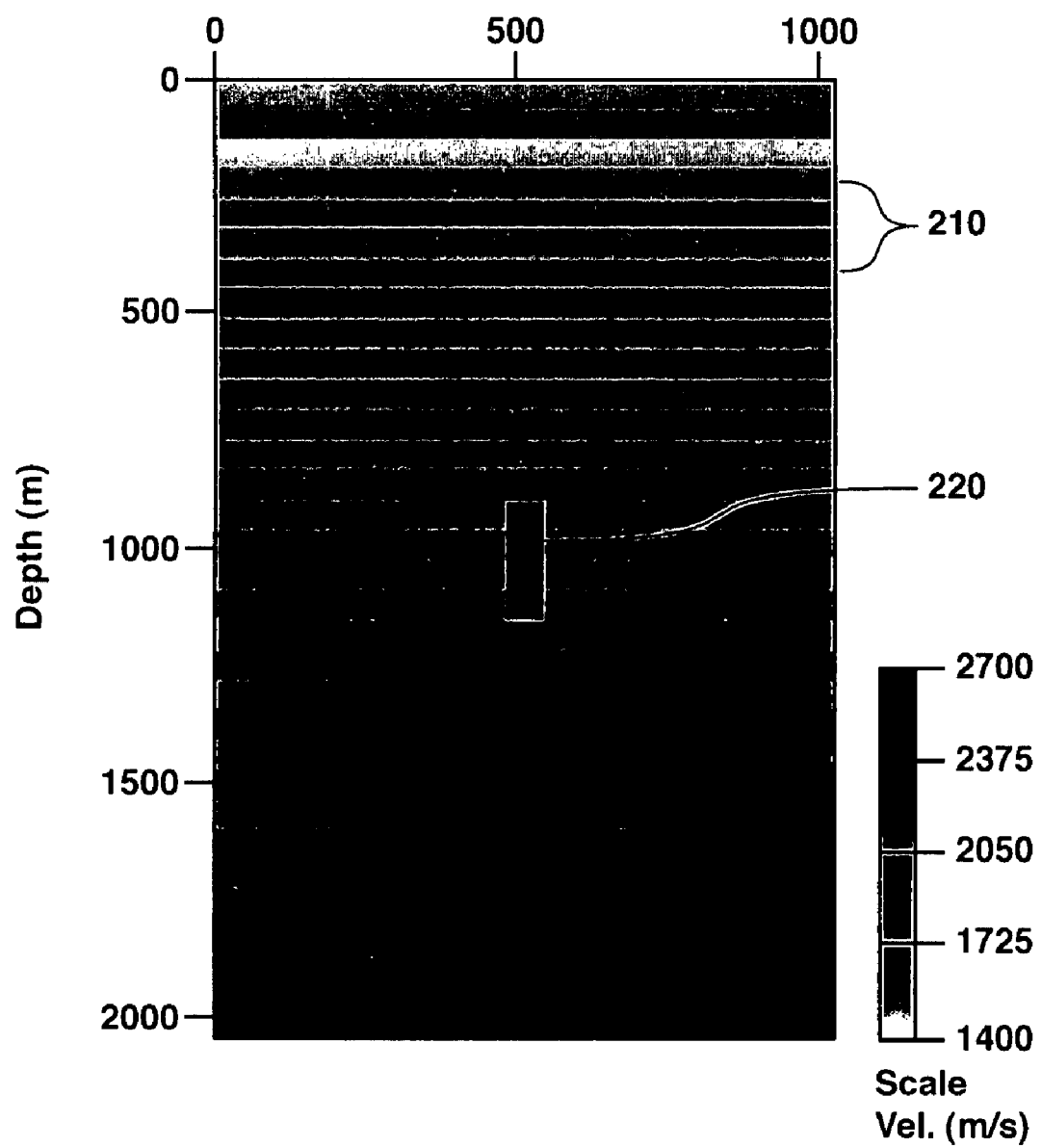
FIG. 3 is a base velocity model for an example demonstrating the computation of the full wavefield cost function.

FIGS. 3-8 represent a synthetic example of computing the cost function using the present invention and comparison with the conventional sequential source method. The geophysical properties model in this simple example is just a model of the acoustic wave velocity. FIG. 3 is the base velocity model (the model that will be inverted for) for this example. The shading indicates the velocity at each depth. The background of this model is a linear gradient starting at 1500 m/s at the top of the model and having a gradient of 0.5 sec$^{-1}$. Thirty-two 64 m thick horizontal layers (210) having a plus or minus 100 m/s velocity are added to the background gradient. The darker horizontal bands in FIG. 3 represent layers where 100 m/s is added to the linear gradient background, and the alternating lighter horizontal bands represent layers where 100 m/s is subtracted from the linear gradient background. Finally a rectangular anomaly (220) that is 256 m tall and 256 m wide and having a velocity perturbation of 500 m/s is added to the horizontally layered model.

Figure 4:
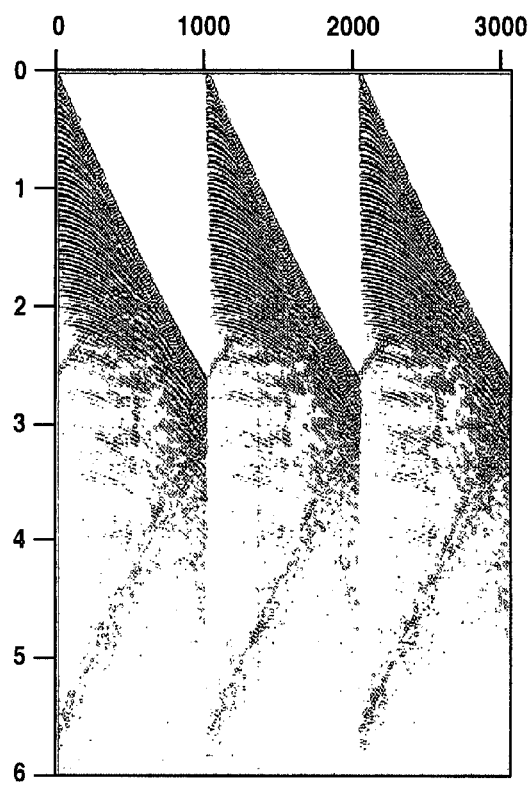
FIG. 4 is a data display showing the first 3 of 256 sequential source data records simulated in the Example from the base model of FIG. 3.

Conventional sequential point source data (corresponding to item 10 in FIG. 1) were simulated from the model in FIG. 3. 256 common point source gathers were computed, and FIG. 4 shows the first three of these gathers. These gathers have a six second trace length and are sampled at 0.8 msec. The source signature (corresponding to $w_s$ in Equation 2) is a 20 Hz Ricker wavelet. The distance between sources is 16 m and the distance between receivers is 4 m. The sources and receivers cover the entire surface of the model, and the receivers are stationary.

The flow outlined in FIG. 1 is used to generate simultaneous encoded-source data from the sequential source data shown in FIG. 4. In step 20 of FIG. 1, all 256 simulated sequential gathers were formed into one group. These gathers were then encoded by convolving the traces from each point source gather with a 2048 sample (1.6384 sec long) uniform pseudo-random sequence. A different random sequence was used for each point source gather. These gathers were then summed to produce the single simultaneous encoded-source gather shown in FIG. 5. It should be noted that this process has converted 256 sequential source gathers to a single simultaneous encoded-source gather.

Figure 6:
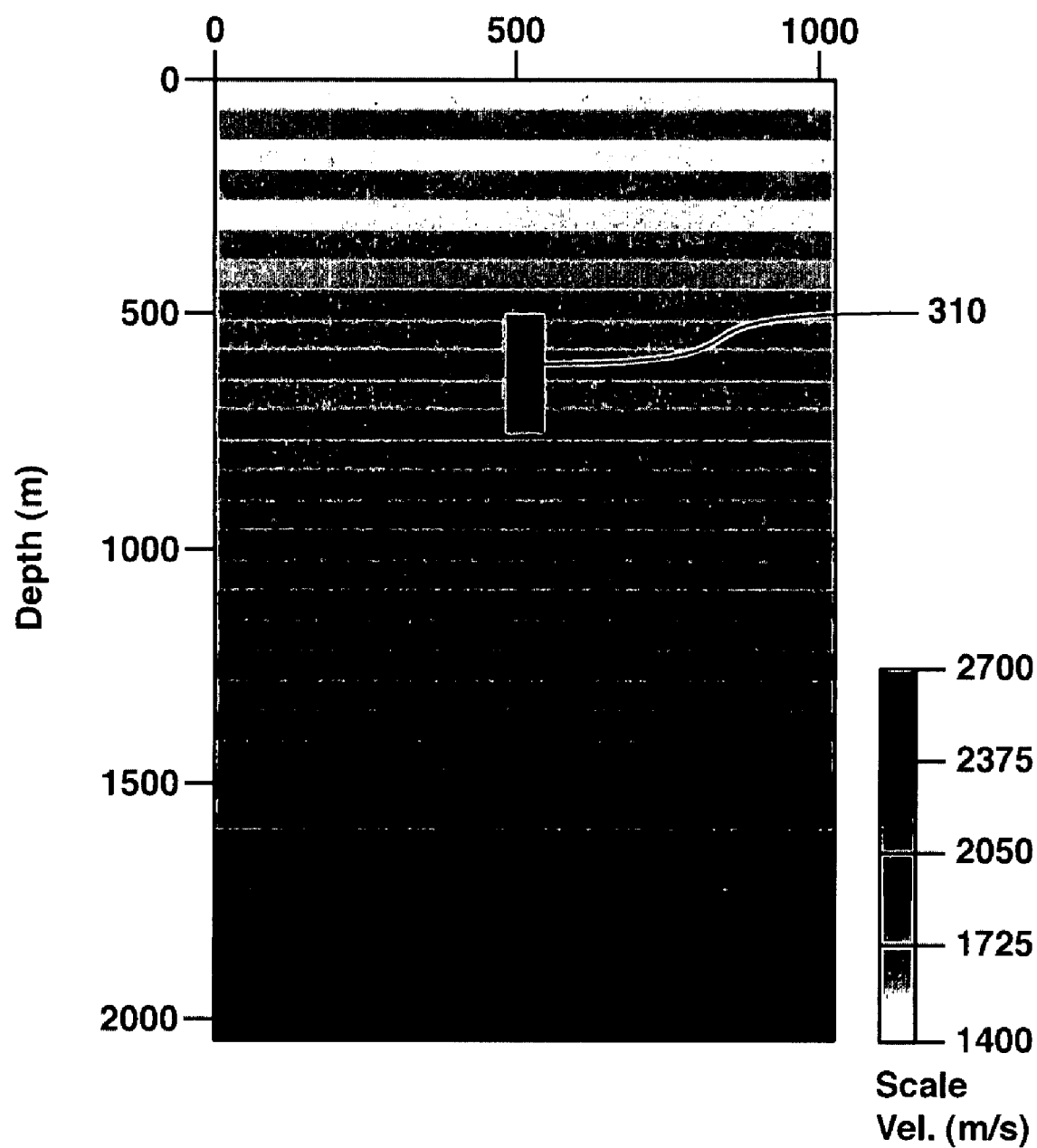
FIG. 6 illustrates one of the perturbations of the base model in FIG. 3 that is used in the Example to demonstrate computation of the full wave inversion cost function using simultaneous sources.

To compute a cost function, the base model is perturbed and seismic data are simulated from this perturbed model. For this example the model was perturbed by changing the depth of the rectangular anomaly. The depth of the anomaly was perturbed over a range of −400 to +400 m relative to its depth in the base model. One perturbation of that model is shown in FIG. 6, with the anomaly indicated at 310.

Figure 5:
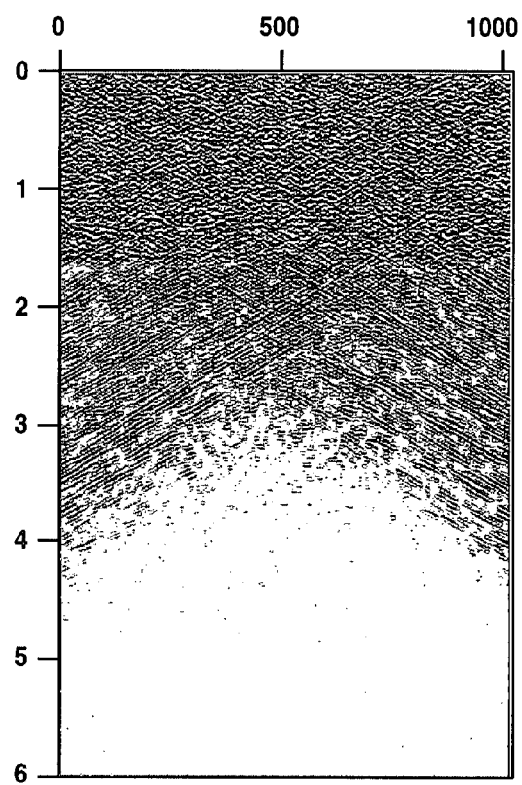
FIG. 5 shows a single simultaneous encoded-source gather produced from the 256 sequential source data records of which the first three are shown in FIG. 4.
Figure 7:
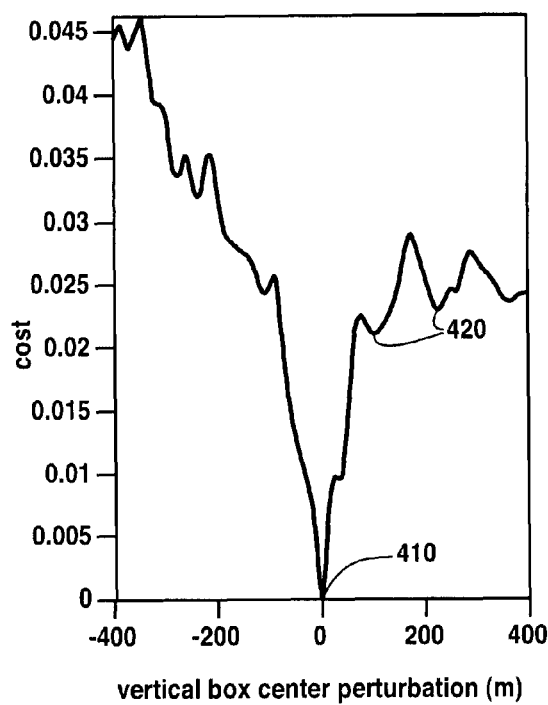
FIG. 7 shows the cost function computed for the present invention's simultaneous source data shown in FIG. 5.
Figure 8:
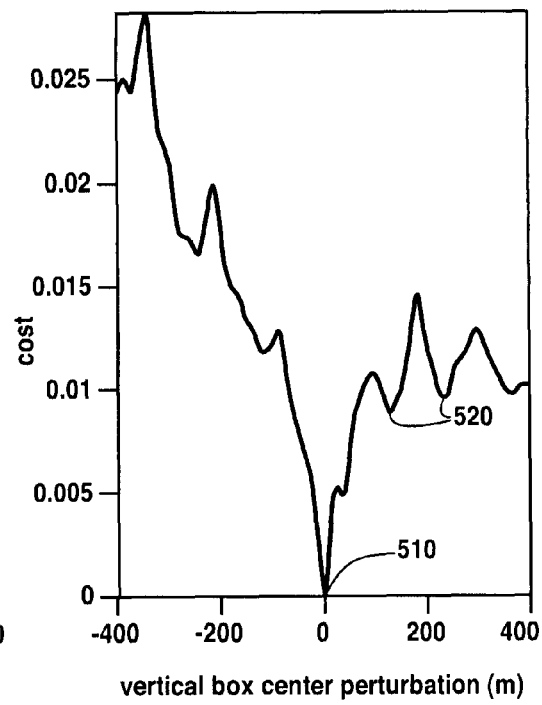
FIG. 8 shows the cost function computed for the sequential source data shown in FIG. 4, i.e., by traditional inversion.

For each perturbation of the base model a single gather of simultaneous encoded-source data was simulated to yield a gather of traces similar to the base data shown in FIG. 5. The encoding signatures used to simulate these perturbed gathers were exactly the same as those used to encode the base data in FIG. 5. The cost function from Equation 6 was computed for each perturbed model by subtracting the perturbed data from the base data and computing the L2 norm of the result. FIG. 7 is a graph of this simultaneous encoded-source cost function. This cost function may be compared to the conventional sequential source cost function for the same model perturbations shown in FIG. 8 (computed using the data in FIG. 4 as the base data and then simulating sequential source data from the perturbed models). FIG. 8 corresponds to the cost function in Equation 2 with N=2. The horizontal axis in FIGS. 7 and 8 is the perturbation of the depth of the rectangular anomaly relative to its depth in the base model. Thus, a perturbation of zero corresponds to the base model. It is important to note that for this example the simultaneous encoded-source cost function was computed 256 times faster than the sequential source cost function.

Two things are immediately noticeable upon inspection of FIGS. 7 and 8. One is that both of these cost functions have their global minimum (410 for the simultaneous source data and 510 for the sequential source data) at zero perturbation as should be the case for an accurate inversion. The second thing to note is that both cost functions have the same number of local minima (420 for the simultaneous source data and 520 for the sequential source data), and that these local minima are located at about the same perturbation values. While local minima are not desirable in a cost function, the local minima structure of the simultaneous encoded-source cost function is similar to the sequential source cost function. Thus, the simultaneous encoded-source cost function (FIG. 7) is just as good as the sequential source cost function (FIG. 8) for seismic inversion.

The factor of 256 computational time reduction of the simultaneous encoded-source cost function, along with similar quality of the two cost functions for seismic inversion, leads to the conclusion that for this example the simultaneous encoded-source cost function is strongly preferred. The perturbed models represent the various model guesses that might be used in a real exercise in order to determine which gives the closest fit, as measured by the cost function, to the measured data.

Figure 9:
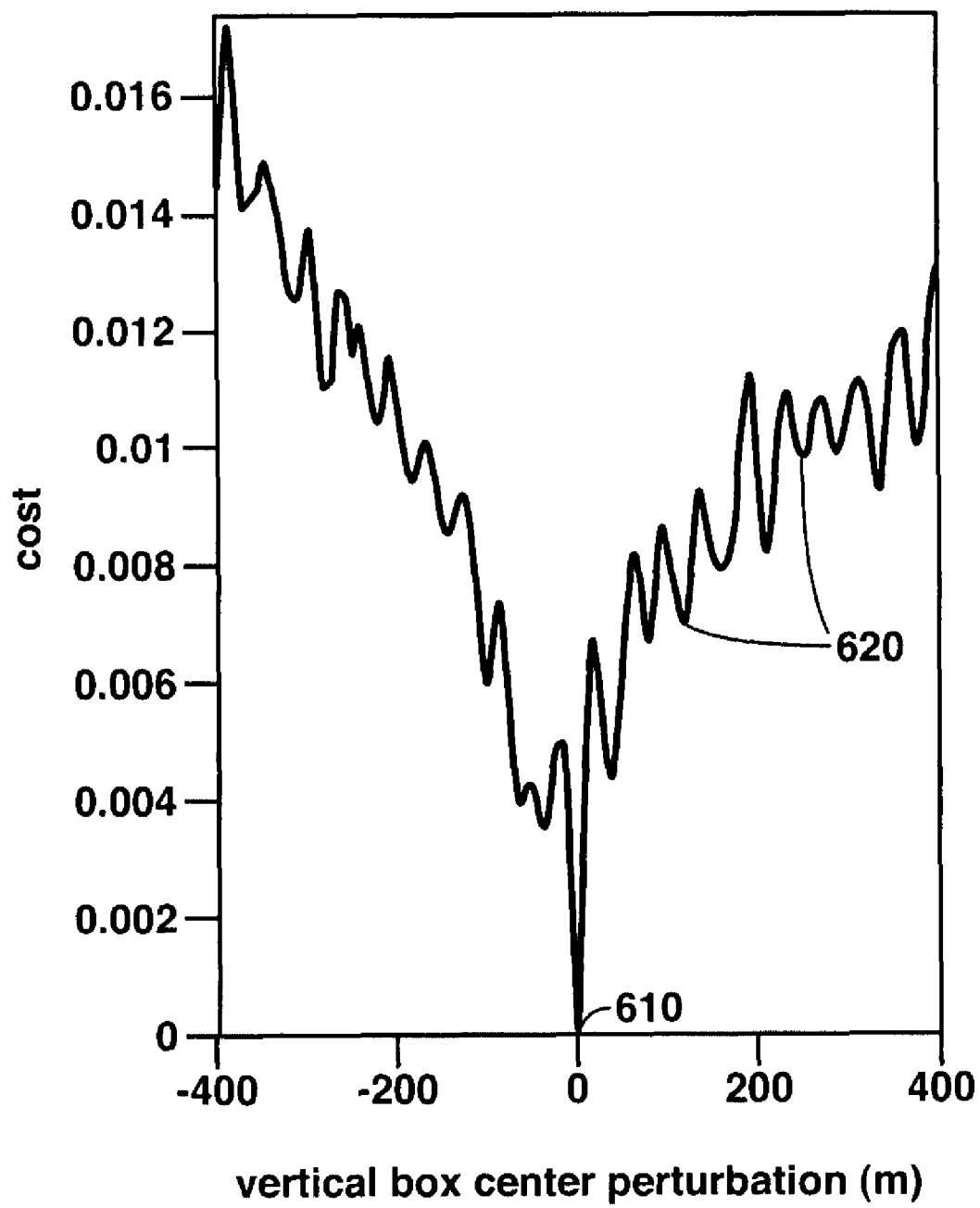
FIG. 9 shows the cost function for a prior-art "super-shot" gather, formed by simply summing the sequential source data shown in FIG. 4.
Figure 10:
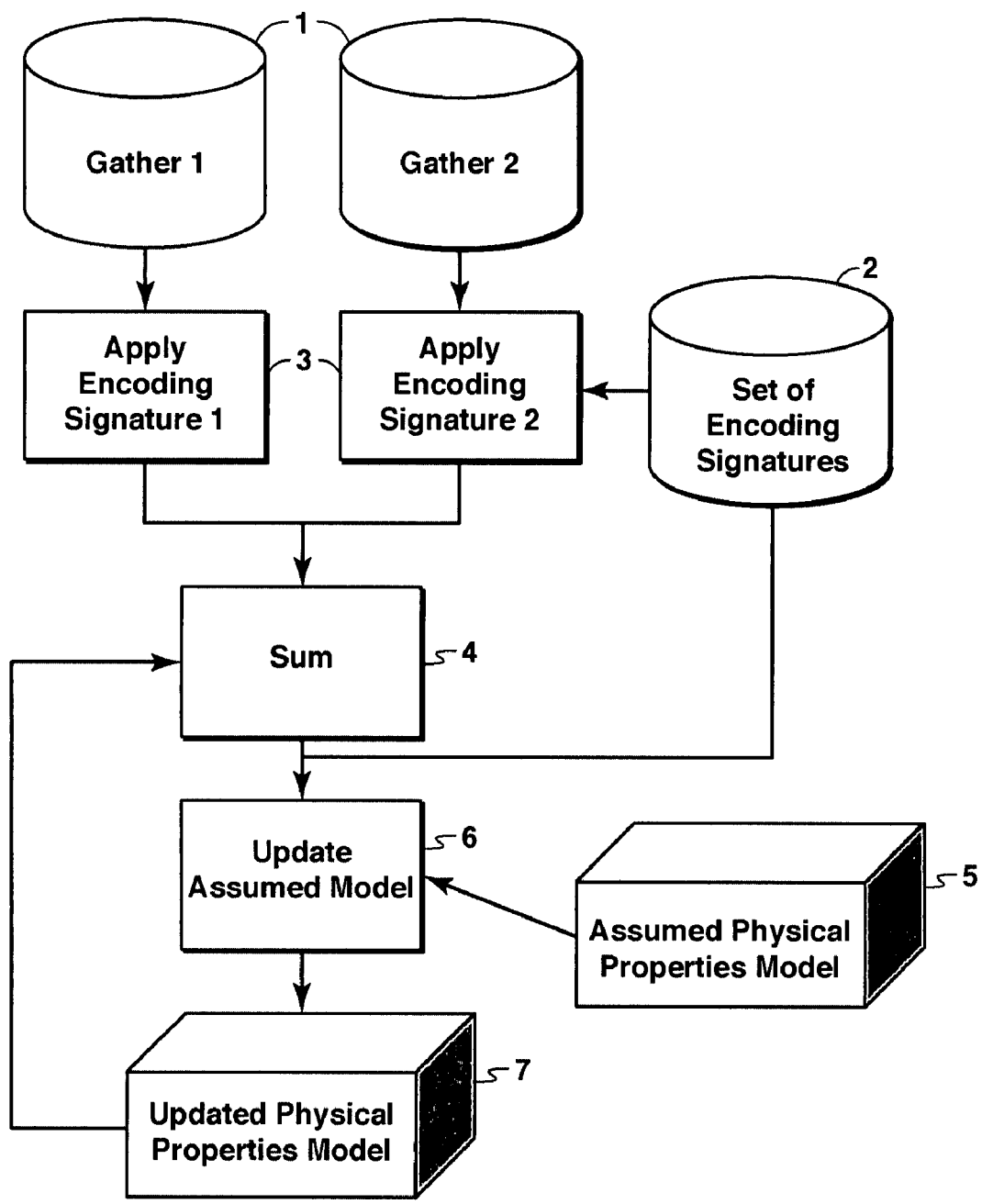
FIG. 10 is a flow chart showing basic steps in one embodiment of the present inventive method.

Finally, to demonstrate the importance of encoding the gathers before summing, FIG. 9 shows the cost function that would result from using Mora's [9] suggestion of inverting super shot gathers. This cost function was computed in a manner similar to that FIG. 7 except that the source gathers were not encoded before summing. This sum violates Mora's suggestion that the sources should be widely spaced (these sources are at a 16 m spacing). However, this is a fair comparison with the simultaneous encoded-source method suggested in this patent, because the computational speedup for the cost function of FIG. 9 is equal to that for FIG. 7, while Mora's widely spaced source method would result in much less speedup. Note that the global minimum for the super shot gather data is at zero perturbation (610), which is good. On the other hand, the cost function shown in FIG. 9 has many more local minima (620) than either the cost functions in FIG. 7 or FIG. 8. Thus, while this cost function achieves the same computational speedup as the simultaneous encoded-source method of this patent, it is of much lower quality for inversion.

The foregoing application is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined in the appended claims. Persons skilled in the art will readily recognize that in preferred embodiments of the invention, at least some of the steps in the present inventive method are performed on a computer, i.e. the invention is computer implemented. In such cases, the resulting updated physical properties model may either be downloaded or saved to computer storage.

REFERENCES

1. Tarantola, A., "Inversion of seismic reflection data in the acoustic approximation," Geophysics 49, 1259-1266 (1984).
2. Sirgue, L., and Pratt G. "Efficient waveform inversion and imaging: A strategy for selecting temporal frequencies," Geophysics 69, 231-248 (2004).
3. Weglein, A. B., Araujo, F. V., Carvalho, P. M., Stolt, R. H., Matson, K. H., Coates, R. T., Corrigan, D., Foster, D. J., Shaw, S. A., and Zhang, H., "Inverse scattering series and seismic exploration," Inverse Problems 19, R27-R83 (2003).
4. Fallat, M. R., Dosso, S. E., "Geoacoustic inversion via local, global, and hybrid algorithms," Journal of the Acoustical Society of America 105, 3219-3230 (1999).
5. Van Manen, D. J., Robertsson, J. O. A., Curtis, A., "Making wave by time reversal," SEG International Exposition and 75$^{th}$ Annual Meeting Expanded Abstracts, 1763-1766 (2005).
6. Berkhout, A. J., "Areal shot record technology," Journal of Seismic Exploration 1, 251-264 (1992).
7. Zhang, Y., Sun, J., Notfors, C., Gray, S. H., Cherris, L., Young, J., "Delayed-shot 3D depth migration," Geophysics 70, E21-E28 (2005).
8. Van Riel, P., and Hendrik, W. J. D., "Method of estimating elastic and compositional parameters from seismic and echo-acoustic data," U.S. Pat. No. 6,876,928 (2005).
9. Mora, P., "Nonlinear two-dimensional elastic inversion of multi-offset seismic data," Geophysics 52, 1211-1228 (1987).
10. Ober, C. C., Romero, L. A., Ghiglia, D. C., "Method of Migrating Seismic Records," U.S. Pat. No. 6,021,094 (2000).
11. Ikelle, L. T., "Multi-shooting approach to seismic modeling and acquisition," U.S. Pat. No. 6,327,537 (2001).
12. Romero, L. A., Ghiglia, D. C., Ober, C. C., Morton, S. A., "Phase encoding of shot records in prestack migration," Geophysics 65, 426-436 (2000).
13. Jing X., Finn, C. J., Dickens, T. A., Willen, D. E., "Encoding multiple shot gathers in prestack migration," SEG International Exposition and 70$^{th}$ Annual Meeting Expanded Abstracts, 786-789 (2000).

The invention claimed is:

1. A computer-implemented method for inversion of measured geophysical data to determine a physical properties model for a subsurface region, comprising:

(a) obtaining a group of two or more encoded gathers of the measured geophysical data, wherein each gather is associated with a single generalized source or, using source-receiver reciprocity, with a single receiver, and wherein each gather is encoded with a different encoding signature selected from a set of non-equivalent encoding signatures;

(b) summing the encoded gathers in the group by summing all data records in each gather that correspond to a single receiver, or source if reciprocity is used, and repeating for each different receiver, resulting in a simultaneous encoded gather;

(c) assuming a physical properties model of the subsurface region, said model providing values of at least one physical property at locations throughout the subsurface region;

(d) calculating an update to the assumed physical properties model that is more consistent with the simultaneous encoded gather from step (b), said calculation involving one or more encoded simultaneous source forward or reverse simulation operations that use the assumed physical properties model and encoded source signatures using the same encoding functions used to encode corresponding gathers of measured data, wherein an entire simultaneous encoded gather is simulated in a single simulation operation;

(e) repeating step (d) at least one iteration, using the updated physical properties model from the previous iteration of step (d) as the assumed model to produce a further updated physical properties model of the subsurface region that is more consistent with a corresponding simultaneous encoded gather of measured data, using the same encoding signatures for source signatures in the simulation as were used in forming the corresponding simultaneous encoded gather of measured data; and (f) downloading the further updated physical properties model or saving it to computer storage.

2. The method of claim 1, wherein a cost function is optimized to update the model in step (d), said cost function measuring degree of misfit between the simultaneous encoded gather and a simulated simultaneous encoded gather.

3. The method of claim 2, wherein the encoding functions are optimized to improve quality of the cost function.

4. The method of claim 2, wherein a global cost function optimization method including Monte Carlo, simulated annealing, genetic or evolution algorithm is used to update the model.

5. The method of claim 2, wherein a local cost function optimization method including gradient line search, conjugate gradients or Newton's method is used to update the model.

6. The method of claim 2, wherein the cost function is an L1-norm cost function or an L2-norm cost function and the cost function contains one or more regularization terms.

7. The method of claim 1, further comprising after step (d) and before step (e): changing the encoding signatures assigned in step (a) and repeating step (b) to obtain a different simultaneous encoded gather of measured data, then using that in performing step (e).

8. The method of claim 1, further comprising obtaining at least one additional group of two or more encoded gathers of the measured geophysical data as in step (a), and performing step (b) for each additional group, then accumulating the corresponding updates to the physical properties model from step (d), wherein the updated physical properties model to be used in step (e) is based on the accumulated updates.

9. The method of claim 1, wherein said encoded gathers of measured data are encoded by temporally convolving all traces from the gather with the encoding signature selected for the gather.

10. The method of claim 9, wherein the measured geophysical data include measured or estimated signatures of each source activation and the encoded source signatures used in the simulation operations are signatures made by temporally convolving the measured or estimated source signatures with the same encoding functions used to encode the corresponding measured gather in step (a).

11. The method of claim 9, wherein the encoding functions are of a type selected from a group consisting of linear, random phase, chirp, modified chirp, random time shift, and frequency independent phase encoding.

12. The method of claim 9, wherein the encoding functions are of one type for some sources and of another type for other sources.

13. The method of claim 1, wherein the two or more encoded gathers of measured data are obtained by obtaining gathers of data from a geophysical survey in which data are acquired from a plurality of simultaneously operating, uniquely encoded source devices.

14. The method of claim 1, wherein the measured geophysical data are from a seismic survey.

15. The method of claim 14, wherein the generalized seismic sources are either all point sources or all plane-wave sources.

16. The method of claim 14, wherein the physical properties models are models of seismic wave velocity, seismic elastic parameters, seismic anisotropy parameters or seismic anelasticity parameters.

17. The method of claim 1, wherein the forward or reverse simulation operations in step (d) are performed with a finite difference, finite element or finite volume simulation code.

18. The method of claim 1, wherein step (d) is performed by steps comprising:

(i) selecting an iterative series solution to a scattering equation describing wave scattering in said subsurface region;

(ii) beginning with the first n terms of said series, where $n \geq 1$, said first n terms corresponding to the assumed physical properties model of the subsurface region;

(iii) computing the next term in the series, said calculation involving one or more encoded simultaneous source forward or reverse simulation operations that use the assumed physical properties model and encoded source signatures using the same encoding functions used to encode corresponding gathers of measured data, wherein an entire simultaneous encoded gather is simulated in a single simulation operation and the simulated encoded gather and measured encoded gather are combined in a manner consistent with the iterative series selected in step (i); and (iv) updating the model by adding the next term in the series calculated in step (iii) to the assumed model.

19. The method of claim 18, further comprising repeating steps (iii) and (iv) for at least one more term in the series.

20. A computer-implemented method for inversion of measured geophysical data to determine a physical properties model for a subsurface region, comprising:

(a) obtaining a group of two or more encoded gathers of the measured geophysical data, wherein each gather is associated with a single generalized source or, using source-receiver reciprocity, with a single receiver, and wherein each gather is encoded with a different encoding signature selected from a set of non-equivalent encoding signatures;

(b) summing the encoded gathers in the group by summing all data records in each gather that correspond to a single receiver, or source if reciprocity is used, and repeating for each different receiver, resulting in a simultaneous encoded gather;

(c) assuming a physical properties model of the subsurface region, said model providing values of at least one physical property at locations throughout the subsurface region;

(d) simulating a synthetic simultaneous encoded gather corresponding to the simultaneous encoded gather of measured data, using the assumed physical properties model, wherein the simulation uses encoded source signatures using the same encoding functions used to encode the simultaneous encoded gather of measured data, wherein an entire simultaneous encoded gather is simulated in a single simulation operation;

(e) computing a cost function measuring degree of misfit between the simultaneous encoded gather of measured data and the simulated simultaneous encoded gather;

(f) updating the physical properties model by optimizing the cost function;

(g) iterating steps (a)-(f) at least one more time using the updated physical properties model from the previous iteration as the assumed physical properties model in step (c), resulting in a further updated physical properties model; and (h) downloading the further updated physical properties model or saving it to computer storage.

21. The method of claim 20, further comprising obtaining at least one additional group of two or more encoded gathers of the measured geophysical data as in step (a), and performing step (b) for each additional group, then accumulating the computed cost functions from step (e), wherein the updating of the physical properties model in step (f) is determined by optimizing the accumulated costs.

22. The method of claim 20, wherein the encoding signature used on a gather in step (a) is changed in at least one of the iterations.

23. A computer-implemented method for inversion of measured geophysical data to determine a physical properties model for a subsurface region, comprising:
   (a) obtaining a group of two or more encoded gathers of the measured geophysical data, wherein each gather is associated with a single generalized source or, using source-receiver reciprocity, with a single receiver, and wherein each gather is encoded with a different encoding signature selected from a set of non-equivalent encoding signatures;
   (b) summing the encoded gathers in the group by summing all data records in each gather that correspond to a single receiver, or source if reciprocity is used, and repeating for each different receiver, resulting in a simultaneous encoded gather;
   (c) assuming a physical properties model of the subsurface region, said model providing values of at least one physical property at locations throughout the subsurface region;
   (d) selecting an iterative series solution to a scattering equation describing wave scattering in said subsurface region;
   (e) beginning with the first n terms of said series, where $n \geq 1$, said first n terms corresponding to the assumed physical properties model of the subsurface region;
   (f) computing the next term in the series, said calculation involving one or more encoded simultaneous source forward or reverse simulation operations that use the assumed physical properties model and encoded source signatures using the same encoding functions used to encode corresponding gathers of measured data, wherein an entire simultaneous encoded gather is simulated in a single simulation operation and the simulated encoded gather and measured encoded gather are combined in a manner consistent with the iterative series selected in step (d);
   (g) updating the model by adding the next term in the series calculated in step (f) to the assumed model;
   (h) repeating steps (f) and (g) for at least one time to add at least one more term to the series to further update the physical properties model; and
   (i) downloading the further updated physical properties model or saving it to computer storage.

24. A computer-implemented method for inversion of measured geophysical data to determine a physical properties model for a subsurface region, comprising:
   (a) obtaining measured geophysical data from a geophysical survey of the subsurface region;
   (b) inverting the measured data by iterative inversion involving simultaneous simulation of survey data representing a plurality of survey sources, or receivers if source-receiver reciprocity is used, wherein source or receiver signatures in the simulation are encoded, resulting in a simulated simultaneous encoded gather of geophysical data, the inversion process involving updating an assumed physical properties model to reduce misfit between the simulated simultaneous encoded gather and a corresponding simultaneous encoded gather formed by summing gathers of measured survey data encoded with the same encoding functions used in the simulation; and
   (c) downloading the updated physical properties model or saving it to computer storage.

25. A method for producing hydrocarbons from a subsurface region, comprising:
   (a) performing a seismic survey of the subsurface region;
   (b) obtaining a velocity model of the subsurface region determined by a method comprising:
   inverting measured survey data by iterative inversion involving simultaneous simulation of the seismic survey data representing a plurality of survey sources, or receivers if source-receiver reciprocity is used, wherein source signatures in the simulation are encoded, resulting in a simulated simultaneous encoded gather of geophysical data, the inversion process involving updating an assumed velocity model to reduce misfit between the simulated simultaneous encoded gather and a corresponding simultaneous encoded gather of measured survey data encoded with the same encoding functions used in the simulation;
   (c) drilling a well into a layer in the subsurface region identified at least partly from an interpretation of structure in the subsurface region made using the determined velocity model; and
   (d) producing hydrocarbons from the well.

26. A computer program product, comprising a non-transitory computer usable medium having a computer readable program code embodied therein, said computer readable program code adapted to be executed to implement a method for inversion of measured geophysical data to determine a physical properties model for a subsurface region, said method comprising:
   (a) inputting a group of two or more encoded gathers of the measured geophysical data, wherein each gather is associated with a single generalized source or, using source-receiver reciprocity, with a single receiver, and wherein each gather is encoded with a different encoding signature selected from a set of non-equivalent encoding signatures;
   (b) summing the encoded gathers in the group by summing all data records in each gather that correspond to a single receiver, or source if reciprocity is used, and repeating for each different receiver, resulting in a simultaneous encoded gather;
   (c) inputting a physical properties model of the subsurface region, said model providing values of at least one physical property at locations throughout the subsurface region;
   (d) simulating a synthetic simultaneous encoded gather corresponding to the simultaneous encoded gather of measured data, using the assumed physical properties model, wherein the simulation uses encoded source signatures using the same encoding functions used to encode the simultaneous encoded gather of measured data, wherein an entire simultaneous encoded gather is simulated in a single simulation operation;
   (e) computing a cost function measuring degree of misfit between the simultaneous encoded gather of measured data and the simulated simultaneous encoded gather;

(f) updating the physical properties model by optimizing the cost function; and (h) iterating steps (a)-(f) at least one more time using the updated physical properties model from the previous iteration as the assumed physical properties model in step (c), using a same or different set of non-equivalent encoding signatures for each iteration, resulting in a further updated physical properties model.

* * * * *